(12) United States Patent
Kim et al.

(10) Patent No.: US 11,758,805 B2
(45) Date of Patent: Sep. 12, 2023

(54) ORGANIC ELECTROLUMINESCENCE DEVICE AND ORGANOMETALLIC COMPOUND FOR ORGANIC ELECTROLUMINESCENCE DEVICE

(71) Applicant: Samsung Display Co., Ltd., Yongin-si (KR)

(72) Inventors: Haejin Kim, Hwaseong-si (KR); Soo-Byung Ko, Yongin-si (KR); Sungbum Kim, Yongin-si (KR); Sujin Shin, Daegu (KR); Eunsoo Ahn, Jinju-si (KR); Eunyoung Lee, Sejong-si (KR); Jaesung Lee, Hwaseong-si (KR); Hyunjung Lee, Pohang-si (KR); Mina Jeon, Hwaseong-si (KR); Junghoon Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 344 days.

(21) Appl. No.: 16/907,940

(22) Filed: Jun. 22, 2020

(65) Prior Publication Data
US 2021/0159430 A1    May 27, 2021

(30) Foreign Application Priority Data
Nov. 25, 2019    (KR) .......................... 10-2019-0152479

(51) Int. Cl.
| | | |
|---|---|---|
| *C07F 15/00* | (2006.01) | |
| *H01L 51/00* | (2006.01) | |
| *H10K 85/30* | (2023.01) | |
| *C09K 11/06* | (2006.01) | |
| *H10K 50/11* | (2023.01) | |
| *H10K 101/10* | (2023.01) | |

(52) U.S. Cl.
CPC ....... *H10K 85/346* (2023.02); *C07F 15/0086* (2013.01); *C09K 11/06* (2013.01); *C07B 2200/05* (2013.01); *C09K 2211/107* (2013.01); *C09K 2211/185* (2013.01); *H10K 50/11* (2023.02); *H10K 2101/10* (2023.02)

(58) Field of Classification Search
CPC .. C07F 15/0086; H01L 51/50; H01L 51/0087; H01L 51/5087
USPC ............... 546/2, 10; 313/504, 498
See application file for complete search history.

(56) References Cited

U.S. PATENT DOCUMENTS

| | | |
|---|---|---|
| 9,318,725 B2 | 4/2016 | Li |
| 9,385,329 B2 | 7/2016 | Li et al. |
| 9,461,254 B2 | 10/2016 | Tsai et al. |
| 9,947,881 B2 | 4/2018 | Li et al. |
| 11,316,117 B2 * | 4/2022 | Han ........................ C09K 11/06 |
| 2013/0048963 A1 | 2/2013 | Beers et al. |
| 2014/0364605 A1 | 12/2014 | Li et al. |
| 2015/0008419 A1 | 1/2015 | Li |
| 2015/0105556 A1 | 4/2015 | Li et al. |
| 2015/0236274 A1 | 8/2015 | Hatakeyama et al. |
| 2017/0012224 A1 | 1/2017 | Li et al. |
| 2017/0317298 A1 | 11/2017 | Anemian et al. |
| 2018/0301629 A1 | 10/2018 | Hatakeyama et al. |
| 2018/0301641 A1 | 10/2018 | Li et al. |
| 2018/0305384 A1 | 10/2018 | Chen et al. |
| 2019/0088887 A1 | 3/2019 | Feldman et al. |
| 2019/0207112 A1 | 7/2019 | Hatakeyama et al. |

FOREIGN PATENT DOCUMENTS

| | | |
|---|---|---|
| CN | 104272487 A | 1/2015 |
| CN | 104693243 A | 6/2015 |
| JP | 2009-267244 A | 11/2009 |
| JP | 2015-81257 A | 4/2015 |
| JP | WO2015/102118 A1 | 3/2017 |
| JP | WO2016/152544 A1 | 2/2018 |
| JP | WO2017/188111 A1 | 2/2019 |
| KR | 10-2014-0117546 A | 10/2014 |
| KR | 10-2015-0043225 A | 4/2015 |
| KR | 10-2018-0118559 A | 10/2018 |
| KR | 10-2019-0033038 A | 3/2019 |
| WO | WO 2013/130483 A1 | 9/2013 |

* cited by examiner

*Primary Examiner* — Charanjit Aulakh
(74) *Attorney, Agent, or Firm* — Lewis Roca Rothgerber Christie LLP

(57) ABSTRACT

An organic electroluminescence device of an embodiment includes a first electrode, a second electrode, and an emission layer between the first electrode and the second electrode, wherein the emission layer includes an organometallic compound represented by Formula 1, and the emission layer may show high emission efficiency properties.

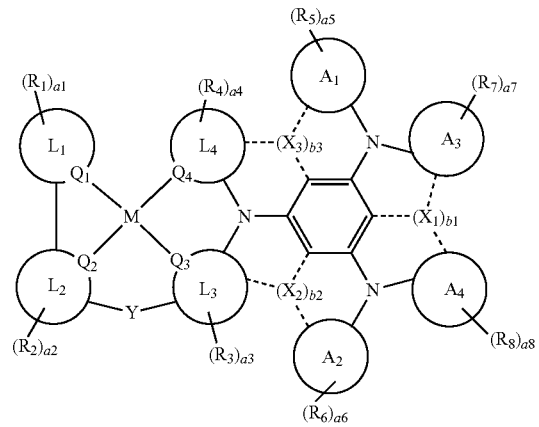

Formula 1

8 Claims, 2 Drawing Sheets

ORGANIC ELECTROLUMINESCENCE DEVICE AND ORGANOMETALLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0152479, filed on Nov. 25, 2019, the entire contents of which are incorporated herein by reference.

BACKGROUND

1. Field

Embodiments of the present disclosure herein relate to an organic electroluminescence device and an organometallic compound used therein.

2. Related Art

Recently, the development of an organic electroluminescence display as an image display is being actively conducted. Different from a liquid crystal display, the organic electroluminescence display is a so-called a self-luminescent display in which holes and electrons injected from a first electrode and a second electrode, respectively, recombine in an emission layer, and a light-emitting material including an organic compound in the emission layer emits light to provide a display.

In the application of an organic electroluminescence device to a display, decreasing the driving voltage, and increasing the emission efficiency and the life of the organic electroluminescence device are desirable, and developments on materials for an organic electroluminescence device stably attaining these features are being substantially continuously investigated.

Additionally, the development of an organometallic compound used as a dopant material has been continued in developing a material for an emission layer, but the development of a dopant material showing high efficiency in a blue emission region is still desirable.

SUMMARY

Embodiments of the present disclosure provide an organometallic compound exhibiting excellent emission efficiency and long-life characteristics.

In addition, embodiments of the present disclosure also provide an organic electroluminescence device including an organometallic compound in an emission layer and having improved device characteristics.

An embodiment of the present disclosure provides an organometallic compound represented by the following Formula 1:

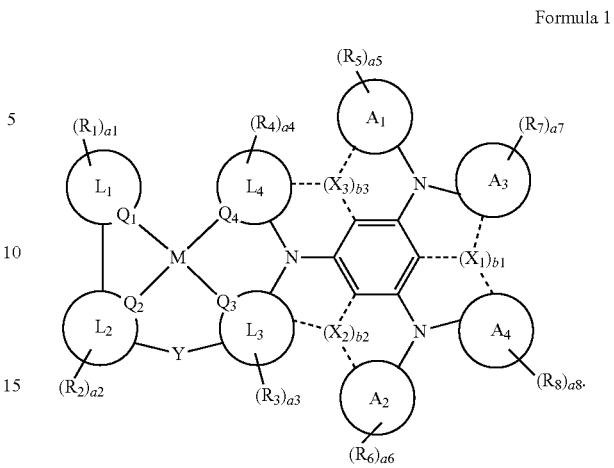

Formula 1

In Formula 1, M is a transition metal, Y is a direct linkage, O, S, Se, $SO_2$, $NR_a$, $BR_b$, $CR_cR_d$, or $SiR_eR_f$, $Q_1$ to $Q_4$ are each independently C or N. $L_1$ to $L_4$ are each independently a substituted or unsubstituted hydrocarbon ring of 5 to 30 carbon atoms for forming a ring, or a substituted or unsubstituted heterocycle of 2 to 30 carbon atoms for forming a ring. At least one selected from among b1 to b3 is 1 and the remainders are 0, where if b1 to b3 are each 1, $X_1$ to $X_3$ are each B. $A_1$ to $A_4$ are each independently a substituted or unsubstituted hydrocarbon ring of 5 to 30 carbon atoms for forming a ring, or a substituted or unsubstituted heterocycle of 2 to 30 carbon atoms for forming a ring. $R_1$ to $R_8$, and $R_a$ to $R_f$ are each independently a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and optionally are combined with an adjacent group to form a ring, and a1 to a8 are each independently an integer of 0 to 3.

In an embodiment, M may be Pt, Pd, Cu, or Os.

In an embodiment, Formula 1 may be represented by any one selected from among the following Formula 1-1 to Formula 1-3:

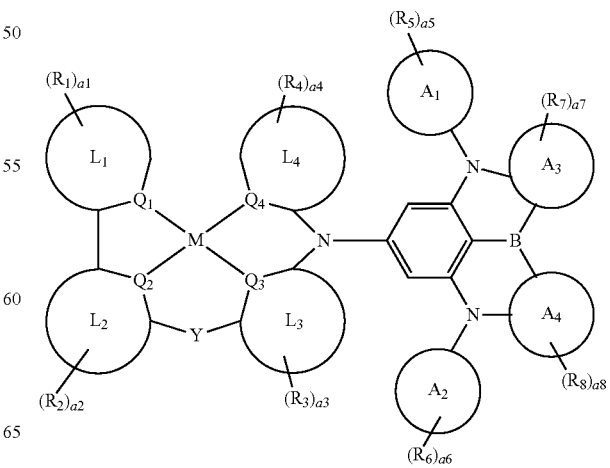

Formula 1-1

-continued

Formula 1-2

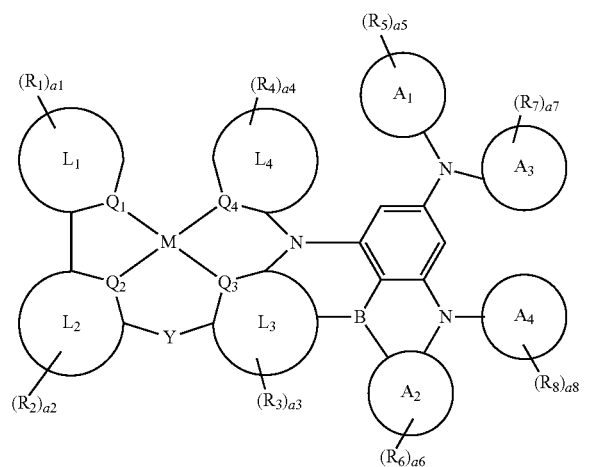

Formula 1-3

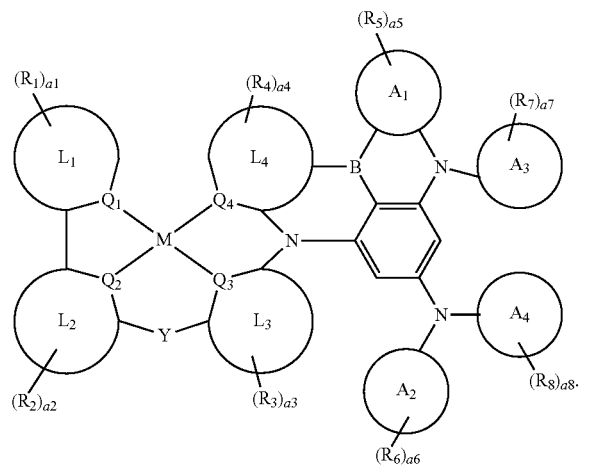

In Formula 1-1 to Formula 1-3, M, Y, $Q_1$ to $Q_4$, $L_1$ to $L_4$, $A_1$ to $A_4$, $R_1$ to $R_8$, and a1 to a8 are the same as defined with respect to Formula 1.

In an embodiment, Formula 1 may be represented by the following Formula 2-A:

Formula 2-A

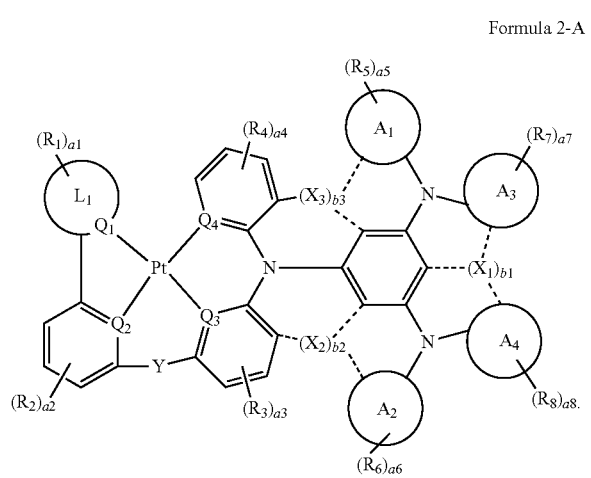

In Formula 2-A, Y, $L_1$, $Q_1$ to $Q_4$, b1 to b3, $X_1$ to $X_3$, $A_1$ to $A_4$, $R_1$ to $R_8$, and a1 to a8 are the same as defined with respect to Formula 1.

In an embodiment, $L_1$ may be represented by the following Formula L-a or Formula L-b:

Formula L-a

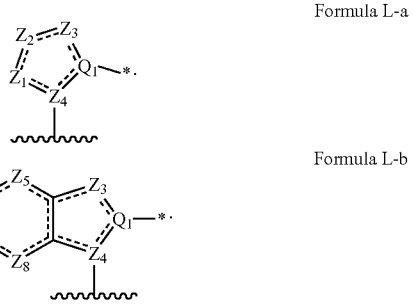

Formula L-b

In Formula L-a and Formula L-b, $Z_1$ to $Z_8$ are each independently N, O, S, NR, or CR, R is a hydrogen atom, a deuterium atom, a halogen atom, a cyano group, a substituted or unsubstituted silyl group, a substituted or unsubstituted carbonyl group, a substituted or unsubstituted oxy group, a substituted or unsubstituted thio group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and optionally is combined with an adjacent group to form a ring, and $Q_1$ is the same as defined with respect to Formula 1.

According to an embodiment of the present disclosure, there is provided an organometallic compound represented by the following Formula A:

Formula A

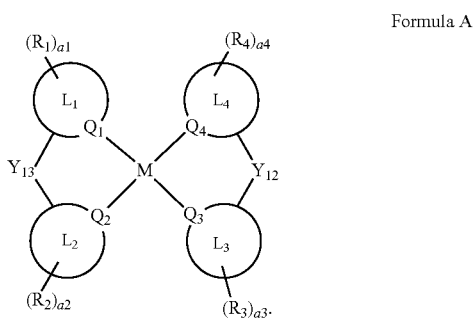

In Formula A, M is a transition metal, $Q_1$ to $Q_4$ are each independently C or N, $L_1$ to $L_4$ are each independently a substituted or unsubstituted hydrocarbon ring of 5 to 30 carbon atoms for forming a ring, or a substituted or unsubstituted heterocycle of 2 to 30 carbon atoms for forming a ring. Any one selected from among $Y_{11}$ to $Y_{13}$ is $NR_{a1}$, $BR_{b1}$, $CR_{c1}R_{d1}$, or $SiR_{e1}R_{f1}$, and the remainder are each independently a direct linkage, O, S, Se, $SO_2$, $NR_a$, $BR_b$, $CR_cR_d$, or $SiR_eR_f$, $R_{a1}$, $R_{b1}$, $R_{c1}$, and $R_{e1}$ are substituted or unsubstituted condensed rings having three or more rings and containing at least one B as a ring-forming atom. $R_1$ to $R_4$, $R_a$ to $R_f$, $R_{d1}$, and $R_{f1}$ are each independently a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and optionally are combined with an adjacent group to form a ring, and a1 to a4 are each independently an integer of 0 to 3.

In an embodiment, at least one selected from among $R_{a1}$, $R_{b1}$, $R_{c1}$, and $R_{e1}$ may be a substituted or unsubstituted condensed ring containing an azaborine moiety.

In an embodiment, Formula A may be represented by any one selected from among the following Formula A-1 to Formula A-3:

Formula A-1

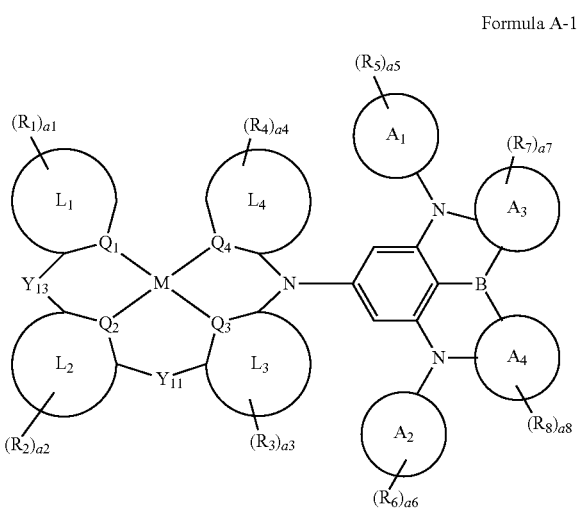

Formula A-2

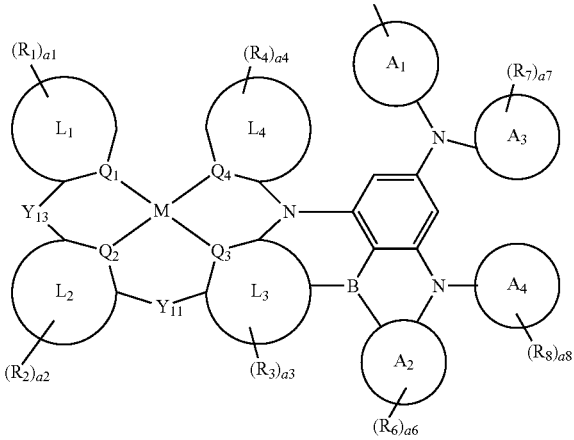

Formula A-3

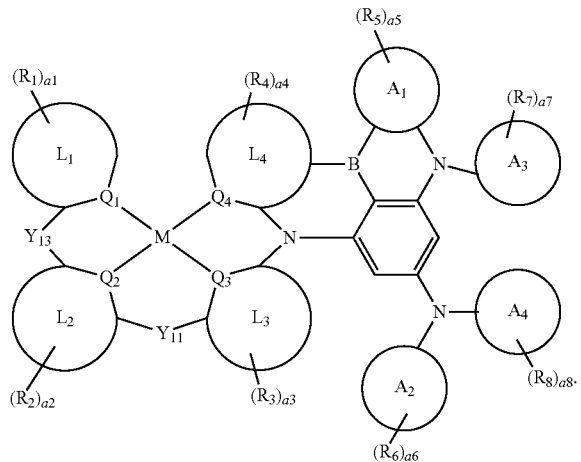

In Formula A-1 to Formula A-3, $A_1$ to $A_4$ are each independently a substituted or unsubstituted hydrocarbon ring of 5 to 30 carbon atoms for forming a ring, or a substituted or unsubstituted heterocycle of 2 to 30 carbon atoms for forming a ring. $R_5$ to $R_8$ are each independently a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and optionally are combined with an adjacent group to form a ring, a5 to a8 are each independently an integer of 0 to 3, and M, $Y_{11}$, $Y_{13}$, $Q_1$ to $Q_4$, $L_1$ to $L_4$, $R_1$ to $R_4$, and a1 to a4 are the same as defined with respect to Formula A.

According to an embodiment of the present disclosure, there is provided an organic electroluminescence device including a first electrode; a second electrode on the first electrode; and an emission layer between the first electrode and the second electrode, wherein the emission layer includes any of the above-described organometallic compound according to an embodiment.

In an embodiment, the emission layer may emit phosphorescence.

In an embodiment, the emission layer may include a host and a dopant, and the dopant may include the above-described organometallic compound according to an embodiment.

BRIEF DESCRIPTION OF THE FIGURES

The accompanying drawings are included to provide a further understanding of the subject matter of the present disclosure and are incorporated in and constitute a part of this specification. The drawings illustrate exemplary embodiments of the present disclosure and, together with the description, serve to explain principles of the subject matter of the present disclosure. In the drawings.

DETAILED DESCRIPTION

Figure 1:
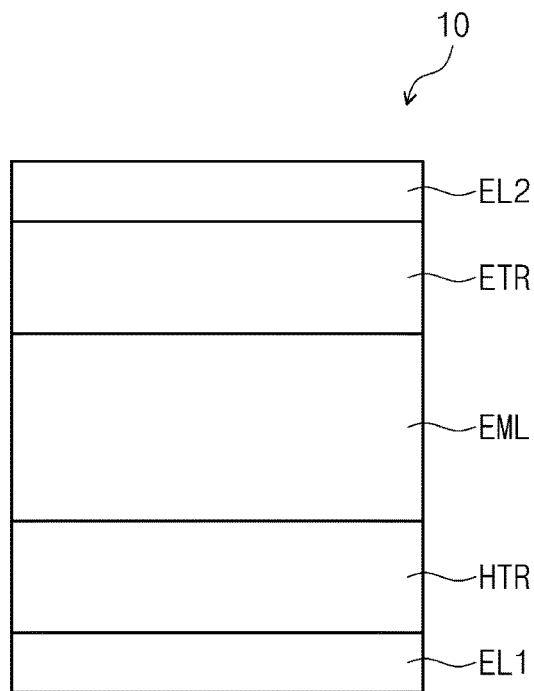
FIG. 1 is a cross-sectional view schematically illustrating an organic electroluminescence device according to an embodiment of the present disclosure.

The subject matter of the present disclosure may have various modifications and may be embodied in different forms, and example embodiments will be explained in more detail with reference to the accompany drawings. The subject matter of the present disclosure may, however, be embodied in different forms and should not be construed as limited to the embodiments set forth herein. Rather, the present disclosure covers all modifications, equivalents, and substituents which are included in the spirit and technical scope of the appended claims, and equivalents thereof.

It will be understood that when an element (or region, layer, part, etc.) is referred to as being "on", "connected to" or "coupled to" another element, it can be directly on, connected or coupled to the other element or a third intervening elements may be present.

Like reference numerals refer to like elements throughout. In addition, in the drawings, the thickness, the ratio, and the dimensions of constituent elements are exaggerated for effective explanation of technical contents.

The term "and/or" includes one or more combinations which may be defined by relevant elements.

It will be understood that, although the terms first, second, etc. may be used herein to describe various elements, these elements should not be limited by these terms. These terms are only used to distinguish one element from another element. Thus, a first element could be termed a second element without departing from the spirit and scope of the present disclosure. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. These terms are relative concepts and are explained based on the direction shown in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the present disclosure and a compound of an embodiment, included therein will be explained with reference to the attached drawings.

FIG. 1 to FIG. 4 are cross-sectional views schematically showing organic electroluminescence devices according to exemplary embodiments of the present disclosure. Referring to FIG. 1 to FIG. 4, in an organic electroluminescence device 10 of an embodiment, a first electrode EU and a second electrode EL2 are facing each other, and an emission layer EML may be between the first electrode EU and the second electrode EL2.

In addition, the organic electroluminescence device 10 of an embodiment further includes a plurality of functional layers between the first electrode EL1 and the second electrode EL2 in addition to the emission layer EML. The plurality of the functional layers may include a hole transport region HTR and an electron transport region ETR. For example, the organic electroluminescence device 10 according to an embodiment may include a first electrode EL1, a hole transport region HTR, an emission layer EML, an electron transport region ETR, and a second electrode EL2, stacked in order. In addition, the organic electroluminescence device 10 of an embodiment may include a capping layer CPL on the second electrode EL2.

The organic electroluminescence device 10 of an embodiment may include an organometallic compound of an embodiment, which will be further explained herein below, in the emission layer EML which is between the first electrode EL1 and the second electrode EL2.

Figure 2:
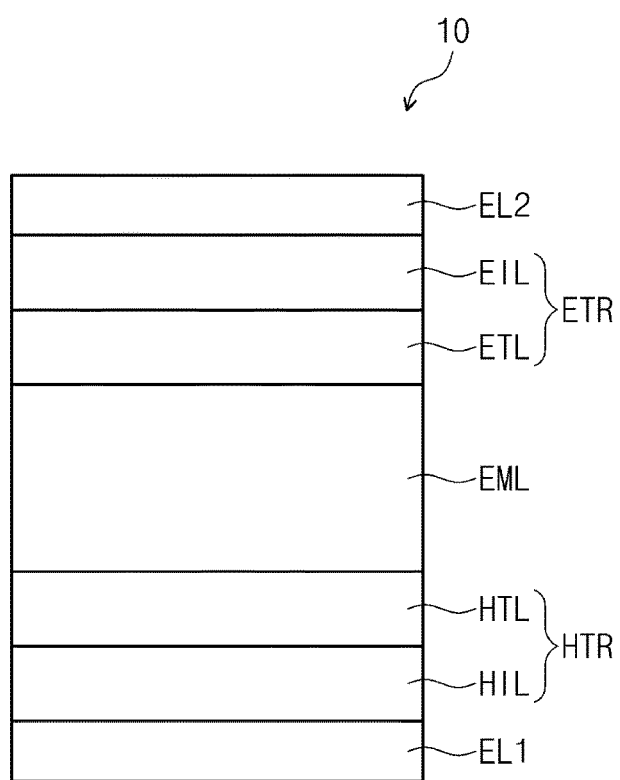
FIG. 2 is a cross-sectional view schematically illustrating an organic electroluminescence device according to an embodiment of the present disclosure.
Figure 3:
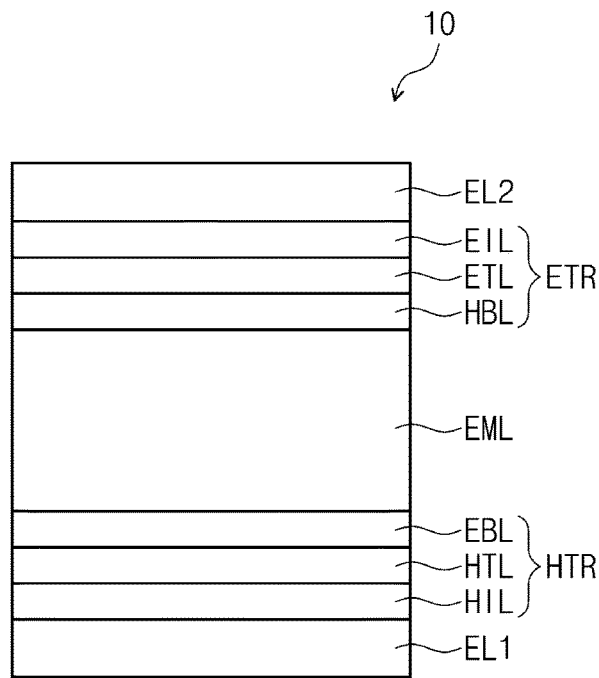
FIG. 3 is a cross-sectional view schematically illustrating an organic electroluminescence device according to an embodiment of the present disclosure.
Figure 4:
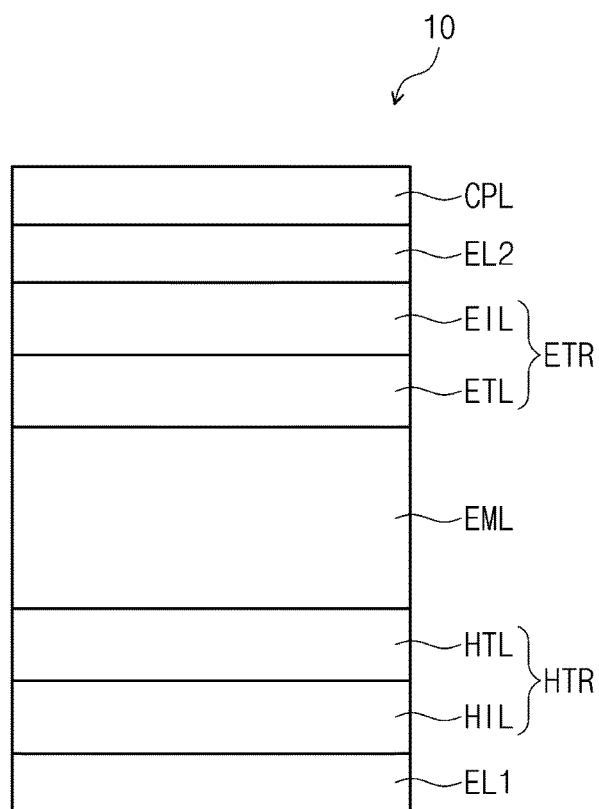
FIG. 4 is a cross-sectional view schematically illustrating an organic electroluminescence device according to an embodiment of the present disclosure.

When compared with FIG. 1, FIG. 2 shows the cross-sectional view of an organic electroluminescence device 10 of an embodiment, wherein a hole transport region HTR includes a hole injection layer HIL and a hole transport layer HTL, and an electron transport region ETR includes an electron injection layer EIL and an electron transport layer ETL. In addition, when compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. When compared with FIG. 2, FIG. 4 shows the cross-sectional view of an organic electroluminescence device 10 of an embodiment, including a capping layer CPL on a second electrode EL2.

The first electrode EL1 has conductivity (e.g., electrical conductivity). The first electrode EL1 may be formed using a metal alloy and/or a conductive compound. The first electrode EL1 may be an anode. Also, the first electrode EU may be a pixel electrode. The first electrode EU may be a transmissive electrode, a transflective electrode, or a reflective electrode. If the first electrode EL1 is the transmissive electrode, the first electrode EL1 may include a transparent metal oxide such as indium tin oxide (ITO), indium zinc oxide (IZO), zinc oxide (ZnO), and indium tin zinc oxide (ITZO). If the first electrode EU is the transflective electrode or the reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or a transflective layer formed using the above materials, and a transparent conductive layer formed using ITO, IZO, ZnO, or ITZO. For example, the first electrode EL1 may include a three-layer structure of ITO/Ag/ITO. However, an embodiment of the present disclosure is not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, and an electron blocking layer EBL. The thickness of the hole transport region HTR may be from about 50 Å to about 15,000 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, or may have a structure of a single layer formed using a hole injection material and a hole transport material. In some embodiments, the hole transport region HTR may have a structure of a single layer formed using a plurality of different materials, or a structure stacked from the first electrode EU of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer EBL, without limitation.

The hole transport region HTR may be formed using various suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound such as copper phthalocyanine, N,N'-diphenyl-N,N'-bis[4-(di-m-tolyl-amino)-phenyl]-biphenyl-4,4'-diamine (DNTPD), 4,4',4''-[tris(3-methylphenyl)phenylamino] triphenylamine (m-MTDATA), 4,4',4''-tris(N,N-diphenylamino)triphenylamine (TDATA), 4,4',4''-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h]quinoxaline-2,3,6,7,10,11-hexacarbonitrile (HAT-CN).

The hole transport layer HTL may include, for example, carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4''-tris(N-carbazolyl)triphenylamine (TCTA), N,N'-di(1-naphthalenyl)-N,N'-diphenyl-benzidine (NPB), 4,4'-cyclohexylidene bis[N,N-bis(4-methylphenyl)benzeneamine] (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 50 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. If the thicknesses of the hole transport region HTR, the hole injection layer HIL, the hole transport layer HTL and the electron blocking layer EBL satisfy the above-described ranges, suitable or satisfactory hole transport properties may be achieved without substantial increase of a driving voltage.

The hole transport region HTR may further include a charge generating material in addition to the above-described materials to increase conductivity (e.g., electrical conductivity). The charge generating material may be dispersed uniformly or non-uniformly in the hole transport region HTR. The charge generating material may be, for example, a p-dopant. The p-dopant may be one of quinone derivatives, metal oxides, and cyano group-containing compounds, without limitation. For example, non-limiting examples of the p-dopant may include quinone derivatives such as tetracyanoquinodimethane (TCNQ) and 2,3,5,6-tetrafluoro-7,7,8,8-tetracyanoquinodimethane (F4-TCNQ), metal oxides such as tungsten oxide, and molybdenum oxide, and inorganic metal compounds such as CuI, and RbI, without limitation.

As described above, the hole transport region HTR may further include at least one of a hole buffer layer and an electron blocking layer EBL in addition to the hole injection layer HIL and the hole transport layer HTL. The hole buffer layer may compensate an optical resonance distance according to the wavelength of light emitted from an emission layer EML and may increase light emission efficiency. Materials which may be included in a hole transport region HTR may be used as materials included in a hole buffer layer. The electron blocking layer EBL is a layer that prevents or reduces the injection of electrons from the electron transport region ETR to the hole transport region HTR.

The emission layer EML is provided on the hole transport region HTR. The emission layer EML may have a thickness of, for example, about 100 Å to about 1,000 Å or from about 100 Å to about 300 Å. The emission layer EML may have a single layer formed using a single material, a single layer formed using a plurality of different materials, or a multilayer structure having a plurality of layers formed using a plurality of different materials.

In the organic electroluminescence device 10 of an embodiment, the emission layer EML may include an organometallic compound of an embodiment, which will be further explained herein below.

Meanwhile, in the description, the term "substituted or unsubstituted" corresponds to substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the description, the term "forming a ring via the combination with an adjacent group" may mean forming a substituted or unsubstituted hydrocarbon ring, or a substituted or unsubstituted heterocycle via the combination with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In addition, the ring formed via the combination with an adjacent group may be combined with another ring to form a spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the description, examples of the halogen atom include a fluorine atom, a chlorine atom, a bromine atom or an iodine atom.

In the description, the alkyl may be a linear, branched or cyclic type (e.g., may be a linear, branched, or cyclic alkyl group). The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the alkenyl group means a hydrocarbon group including one or more carbon double bonds in the middle or at the terminal of an alkyl group of 2 or more carbon atoms. The alkenyl group may be a linear chain or a branched chain. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl group, a styrenyl group, a styrylvinyl group, etc., without limitation.

In the description, the alkynyl group means a hydrocarbon group including one or more carbon triple bonds in the middle or at the terminal of an alkyl group of 2 or more carbon atoms. The alkynyl group may be a linear chain or a branched chain. The carbon number is not specifically limited but may be 2 to 30, 2 to 20, or 2 to 10. Examples of the alkynyl group may include an ethynyl group, a propynyl group, etc., without limitation.

In the description, the hydrocarbon ring group may be an optional functional group or substituent, which is derived from an aliphatic hydrocarbon ring, or an optional functional group or substituent derived from an aromatic hydrocarbon ring. The carbon number of the hydrocarbon ring group for forming a ring may be 5 to 60, 5 to 30, or 5 to 20.

In the description, the aryl group means an optional functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenylyl, terphenylyl, quaterphenylyl, quinquephenylyl, sexiphenylyl, triphenylenyl, pyrenyl, benzofluoranthenyl, chrysenyl, etc., without limitation.

In the description, the heterocyclic group means an optional functional group or substituent derived from a ring including one or more heteroatoms selected from among B, O, N, P, Si and S. The heterocyclic group includes an aliphatic heterocyclic group and an aromatic heterocyclic group. The aromatic heterocyclic group may be a heteroaryl group. The aliphatic heterocycle group and the aromatic heterocycle group may be a monocycle group or polycycle group.

In the description, the heterocyclic group may include one or more selected from among B, O, N, P, Si and S as heteroatoms. If the heterocyclic group includes two or more heteroatoms, two or more heteroatoms may be the same or different. The heterocyclic group may be a monocyclic heterocyclic group or a polycyclic heterocyclic group, and has the concept of including a heteroaryl group. The carbon number for forming a ring of the heterocyclic group may be 2 to 30, 2 to 20, or 2 to 10.

In the description, the aliphatic heterocyclic group may include one or more selected from among B, O, N, P, Si and S as heteroatoms. The carbon number for forming a ring of the aliphatic heterocyclic group may be 2 to 30, 2 to 20, or 2 to 10. Examples of the aliphatic heterocyclic group include an oxirane group, a thiirane group, a pyrrolidine group, a piperidine group, a tetrahydrofuran group, a tetrahydrothiophene group, a thiane group, a tetrahydropyrane group, a 1,4-dioxane group, etc., without limitation.

In the description, the heteroaryl group may include one or more selected from among B, O, N, P, Si and S as heteroatoms. If the heteroaryl group includes two or more heteroatoms, two or more heteroatoms may be the same or different. The heteroaryl group may be a monocyclic heterocyclic group or a polycyclic heterocyclic group. The carbon number for forming a ring of the heteroaryl group may be 2 to 30, 2 to 20, or 2 to 10. Examples of the heteroaryl group may include thiophenyl, furanyl, pyrrolyl, imidazolyl, thiazolyl, oxazolyl, oxadiazolyl, triazolyl, pyridinyl, bipyridinyl, pyrimidinyl, triazinyl, acridyl, pyridazinyl, pyrazinyl, quinolinyl, quinazolinyl, quinoxalinyl, phenoxazinyl, phthalazinyl, pyrido pyrimidinyl, pyrido pyrazinyl, pyrazino pyrazinyl, isoquinolinyl, indolyl, carbazolyl, N-arylcarbazolyl, N-heteroarylcarbazolyl, N-alkylcarbazolyl, benzoxazolyl, benzoimidazolyl, benzothiazolyl, benzocarbazolyl, benzothiophenyl, dibenzothiophenyl, thienothiophenyl, benzofuranyl, phenanthrolinyl, isooxazolyl, thiadiazolyl, phenothiazinyl, dibenzosilolyl, dibenzofuranyl, etc., without limitation.

In the description, the silyl group includes an alkyl silyl group, and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the carbon number of the amine group (or amino group) is not specifically limited, but may be 1 to 30. The amine group may include an alkyl amine group, an aryl amine group, or a heteroaryl amine group. Examples of the amine group include a methylamine group, a dimethylamine group, a phenylamine group, a diphenylamine group, a naphthylamine group, a 9-methyl-anthracenylamine group, etc., without limitation.

In the description, the thio group may include an alkyl thio group and an aryl thio group.

In the description, the oxy group may include an alkoxy group and an aryl oxy group. The alkoxy group may be a linear, branched or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, an embodiment of the present disclosure is not limited thereto.

In the description, the alkyl group in the alkyl thio group, alkyl sulfoxy group, alkyl aryl group, alkyl amino group, alkyl boryl group and alkyl silyl group is the same as the above-described examples of the alkyl group.

In the description, the aryl group in the aryl oxy group, aryl thio group, aryl sulfoxy group, aryl amino group, aryl boron group, aryl silyl group, aryl selenium group, and aryl alkyl group is the same as the above-described examples of the aryl group.

In the description, the direct linkage may mean a single bond.

Meanwhile, in the description, "

" or "——" means a connected position.

In addition, in the description, "- - -" means a selective bond with an adjacent atom or substituent. For example, "- - -" may be connected with an adjacent part via a single bond, or may be a part not forming a bond.

The organometallic compound according to an embodiment may be represented by the following Formula 1:

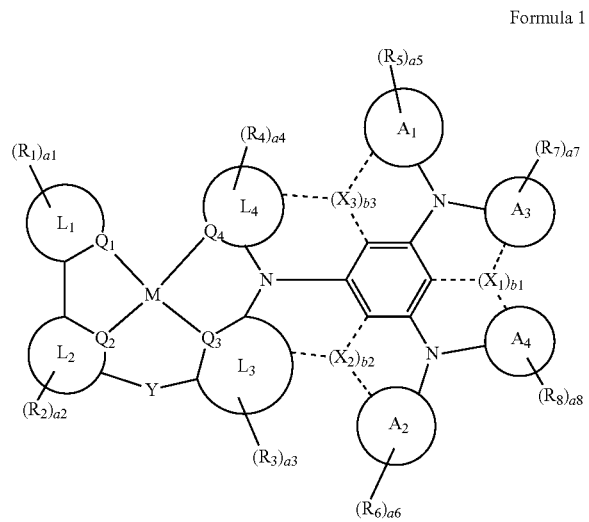

Formula 1

In Formula 1, M is a central metal atom, and M is a transition metal. In Formula 1, Y is a direct linkage, O, S, Se, $SO_2$, $NR_a$, $BR_b$, $CR_cR_d$, or $SiR_eR_f$.

In Formula 1, $Q_1$ to $Q_4$ are each independently C or N. In addition, $L_1$ to $L_4$ are each independently a substituted or unsubstituted hydrocarbon ring of 5 to 30 carbon atoms for forming a ring, or a substituted or unsubstituted heterocycle of 2 to 30 carbon atoms for forming a ring.

In Formula 1, at least one selected from among b1 to b3 is 1 (e.g., b1 to b3 are each independently 0 or 1, and at least one selected from b1 to b3 is 1), and the remainder are 0, where if b1 to b3 are each 1, $X_1$ to $X_3$ are each B. For example, when any of b1 to b3 is 1, a corresponding one of $X_1$ to $X_3$ is B.

$A_1$ to $A_4$ are each independently a substituted or unsubstituted hydrocarbon ring of 5 to 30 carbon atoms for forming a ring, or a substituted or unsubstituted heterocycle of 2 to 30 carbon atoms for forming a ring.

$R_1$ to $R_8$, and $R_a$ to $R_f$ are each independently a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and optionally are combined with an adjacent group to form a ring.

In Formula 1, a1 to a8 are each independently an integer of 0 to 3. Meanwhile, if a1 to a8 are an integer of 2 or more, a plurality of $R_1$ to $R_8$ may be each independently the same, or at least one thereof may be different. For example, if a1 is an integer of 2 or more, a plurality of $R_1$ groups may be the same, or at least one $R_1$ may be different from the remaining $R_1$ groups. Meanwhile, if a1 is an integer of 2 or more, a plurality of $R_1$ groups may be combined with each other to form a ring. The explanation referring to the plurality of $R_1$ groups may be applied to $R_2$ to $R_8$ in the same way.

Meanwhile, if a1 to a8 are each independently 0, $L_1$ to $L_4$ and $A_1$ to $A_4$ may be each independently an unsubstituted aryl group, or an unsubstituted heteroaryl group.

Each of $R_1$ to $R_8$, and $R_a$ to $R_f$ may be combined with an adjacent hydrocarbon ring or adjacent heterocycle to form a condensed ring. In addition, $R_1$ to $R_8$, and $R_a$ to $R_f$ may be each independently combined with adjacent substituents to form a ring.

For example, the ring formed by the combination with the adjacent group and the ring formed by the combination with the adjacent substituents may be a hydrocarbon ring of 5 to 30 carbon atoms for forming a ring, or a heterocycle of 2 to 30 carbon atoms for forming a ring.

The organometallic compound of an embodiment, represented by Formula 1 may have a combined structure of a metal complex moiety including a central metal atom M and a condensed ring group containing boron (B).

In Formula 1, the metal complex moiety may be represented by Formula 1A below, and the condensed ring group containing boron (B) may be represented by Formula 1B below. Meanwhile, the condensed ring group represented by Formula 1B may include at least one B atom as a ring-forming atom. For example, the condensed ring group represented by Formula 1B includes a B atom, and may be a condensed ring group obtained by condensing three or more rings.

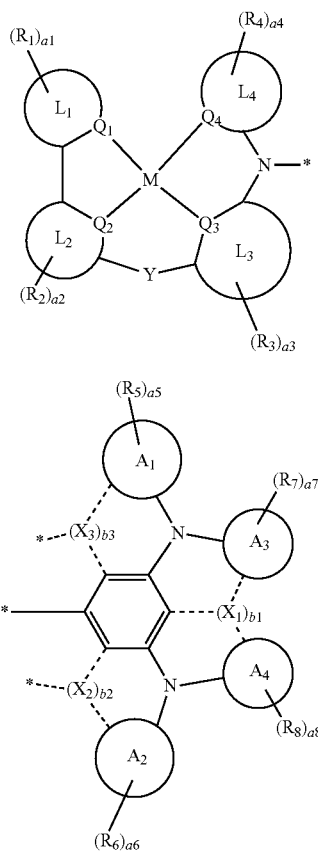

Formula 1A

Formula 1B

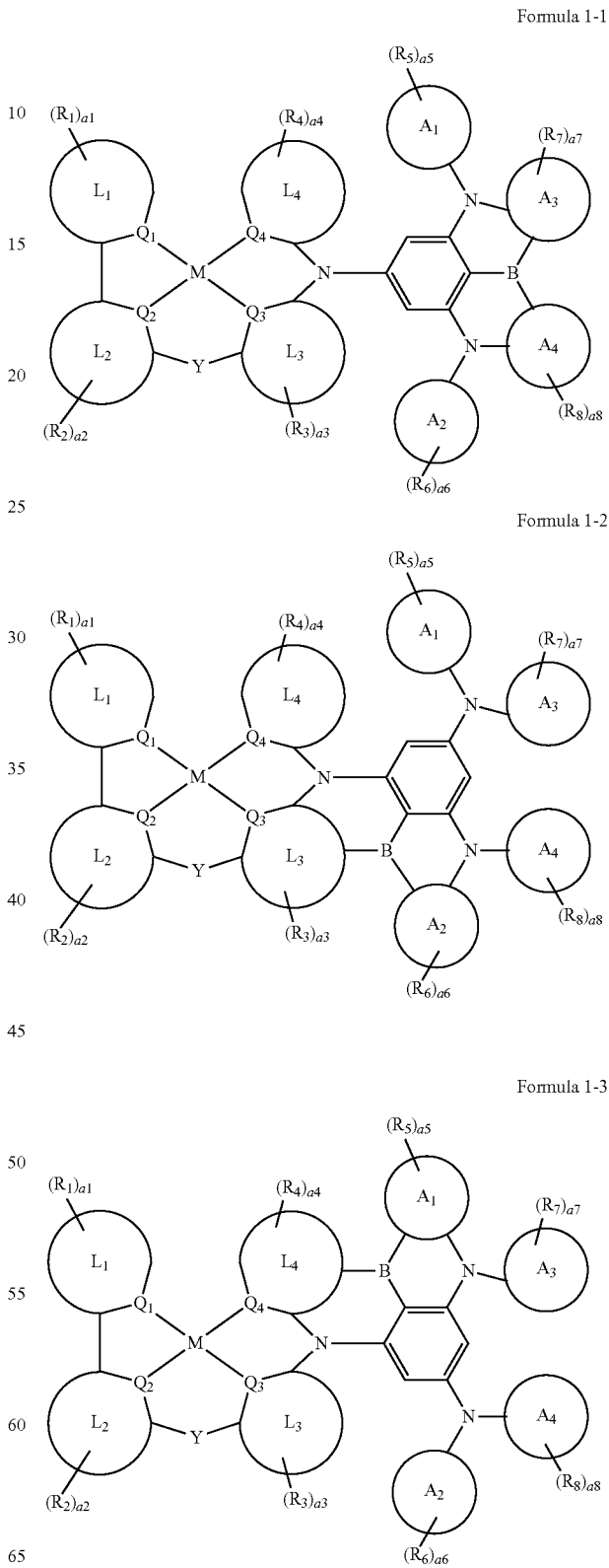

Formula 1-1

Formula 1-2

Formula 1-3

The organometallic compound of an embodiment has a combined structure of a metal complex and a condensed ring group containing B, and may show a high metal to ligand charge transfer (MLCT) ratio in one compound. Accordingly, the organometallic compound of an embodiment shows a high MLCT ratio, and if used as a material for an emission layer, may contribute to the increase of the efficiency of an organic electroluminescence device. Meanwhile, the MLCT ratio explained in the description refers to a triplet metal to ligand charge transfer ($^3$MLCT) ratio and shows a relative ratio based on a case where 100% charge transfer is carried out from a metal atom to a ligand.

The organometallic compound represented by Formula 1 has a combined structure of a metal complex and a condensed ring group including B, and if used as a material for an emission layer, improved efficiency properties are shown. In addition, due to the structure of Formula 1B, blue shifted light may be emitted.

In Formula 1, M may be a four-coordinate metal atom which may be combined with ligands. M may be a metal atom such as platinum (Pt), palladium (Pd), copper (Cu), and osmium (Os), and, for example, M may be Pt.

In Formula 1, at least one selected from among b1 to b3 may be 1, and the remainder may be 0, for example, any one selected from among b1 to b3 may be 1, and the remainder may be 0. If any one selected from among b1 to b3 is 1, any corresponding one selected from among $X_1$ to $X_3$ may correspond to B.

Formula 1 may be represented by any one selected from among Formula 1-1 to Formula 1-3 below. Formula 1-1 corresponds to Formula 1 where b1 is 1, and both b2 and b3 are 0, Formula 1-2 corresponds to Formula 1 where b2 is 1, and both b1 and b3 are 0, and Formula 1-3 corresponds to Formula 1 where b3 is 1, and both b1 and b2 are 0.

In Formula 1-1 to Formula 1-3, the organometallic compound according to an embodiment may include an aza-borine moiety.

Meanwhile, in Formula 1-1 to Formula 1-3, the same explanation on M, Y, $Q_1$ to $Q_4$, $L_1$ to $L_4$, $A_1$ to $A_4$, $R_1$ to $R_8$, and a1 to a8 referring to Formula 1 may be applied.

In Formula 1, $Q_1$ to $Q_4$ are each independently C or N. In addition, $L_1$ to $L_4$, and $A_1$ to $A_4$ are each independently a substituted or unsubstituted hydrocarbon ring of 5 to 30 carbon atoms for forming a ring, or a substituted or unsubstituted heterocycle of 2 to 30 carbon atoms for forming a ring.

For example, $L_1$ to $L_4$, and $A_1$ to $A_4$ may be each independently a substituted or unsubstituted aromatic ring of 5 to 10 carbon atoms for forming a ring, or a substituted or unsubstituted heterocycle of 2 to 10 carbon atoms for forming a ring, including N, O, or S as a heteroatom. In some embodiments, in the organometallic compound according to an embodiment, represented by Formula 1, $L_2$ to $L_4$ may be each independently a substituted or unsubstituted benzene ring, or a substituted or unsubstituted pyridine ring.

In Formula 1, $L_1$ may be represented by the following Formula L-a or L-b:

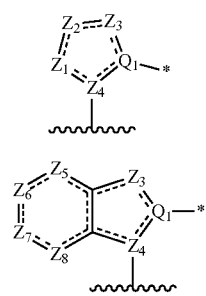

Formula L-a

Formula L-b

In Formula L-a and Formula L-b, $Q_1$ is C or N. In addition, in Formula L-a and Formula L-b, "—" is a part combined with M which is a metal atom, and "

is a part combined with $L_2$.

In Formula L-a and Formula L-b, $Z_1$ to $Z_8$ are each independently N, O, S, NR, or CR, R is a hydrogen atom, a deuterium atom, a halogen atom, a cyano group, a substituted or unsubstituted silyl group, a substituted or unsubstituted carbonyl group, a substituted or unsubstituted oxy group, a substituted or unsubstituted thio group, a substituted or unsubstituted amine group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and optionally may be combined with an adjacent group to form a ring.

$L_1$ may be represented by any one selected from among the compounds represented in the following Compound Group L:

Compound Group L

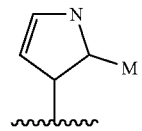
L-1

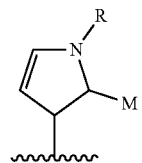
L-2

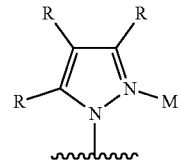
L-3

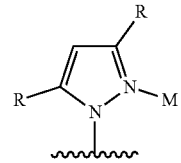
L-4

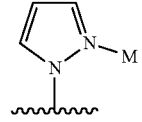
L-5

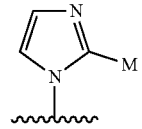
L-6

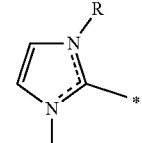
L-7

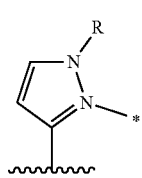
L-8

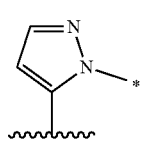
L-9

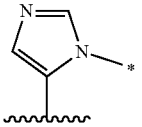
L-10

-continued
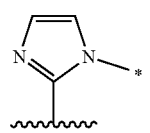 L-11
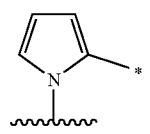 L-12
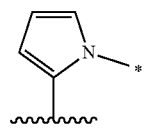 L-13
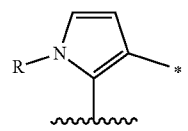 L-14
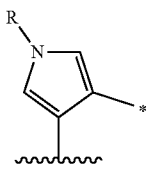 L-15
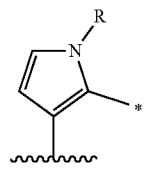 L-16
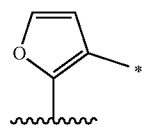 L-17
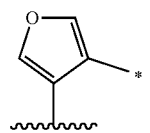 L-18
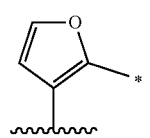 L-19
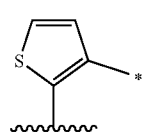 L-20
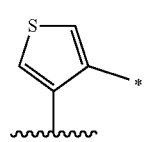 L-21
-continued
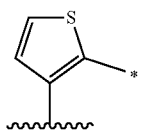 L-22
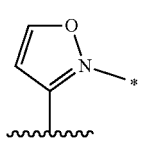 L-23
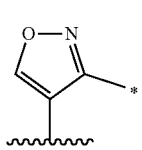 L-24
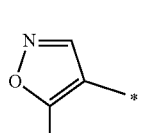 L-25
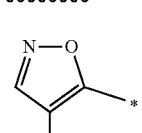 L-26
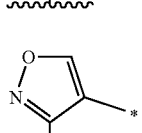 L-27
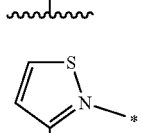 L-28
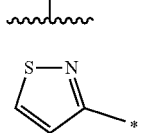 L-29
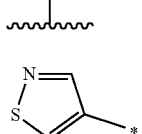 L-30
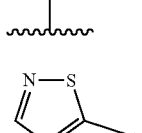 L-31
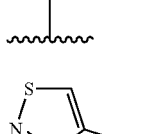 L-32

-continued
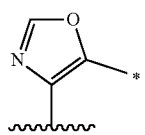 L-33
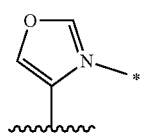 L-34
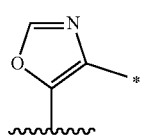 L-35
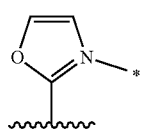 L-36
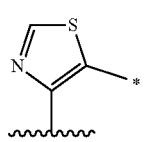 L-37
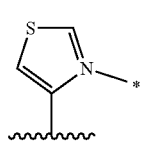 L-38
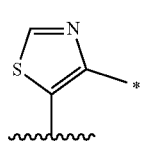 L-39
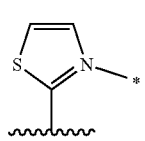 L-40
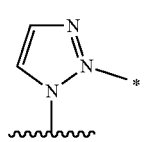 L-41
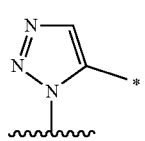 L-42
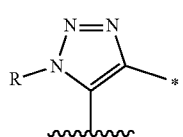 L-43
-continued
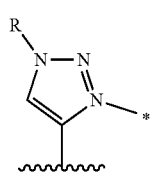 L-44
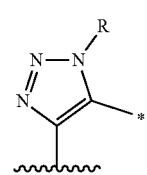 L-45
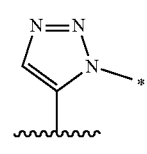 L-46
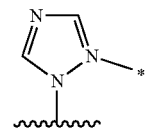 L-47
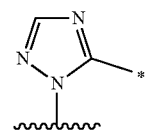 L-48
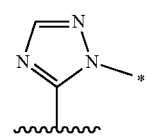 L-49
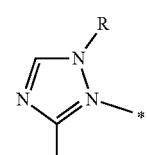 L-50
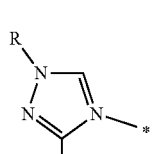 L-51
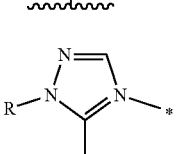 L-52
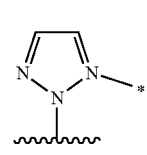 L-53

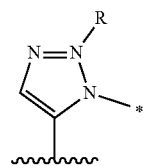 L-54
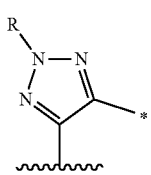 L-55
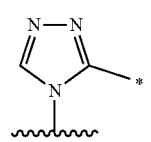 L-56
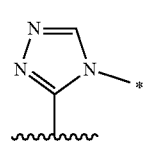 L-57
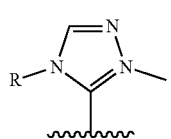 L-58
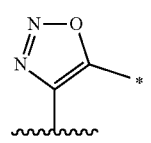 L-59
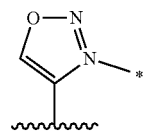 L-60
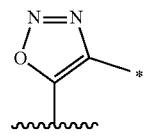 L-61
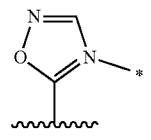 L-62
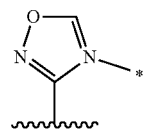 L-63
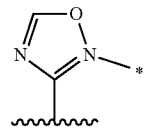 L-64
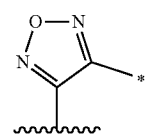 L-65
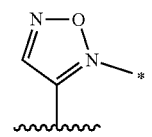 L-66
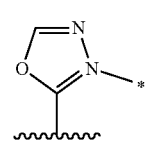 L-67
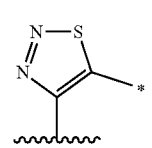 L-68
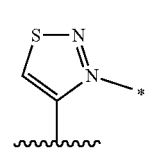 L-69
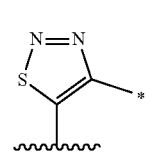 L-70
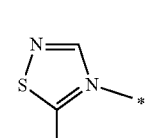 L-71
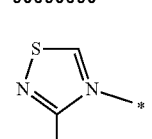 L-72
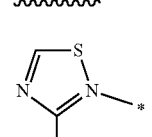 L-73
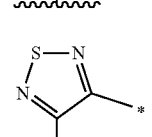 L-74
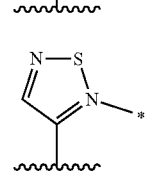 L-75

-continued
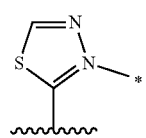 L-76
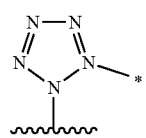 L-77
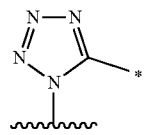 L-78
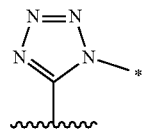 L-79
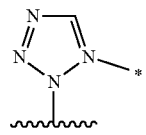 L-80
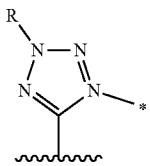 L-81
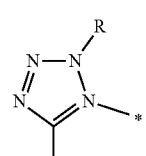 L-82
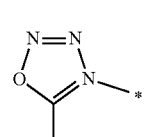 L-83
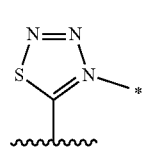 L-84
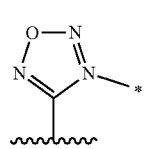 L-85
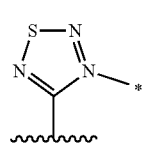 L-86
-continued
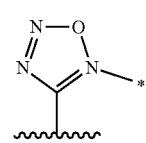 L-87
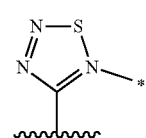 L-88
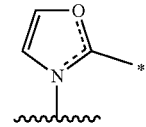 L-89
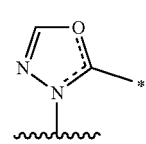 L-90
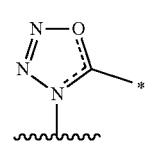 L-91
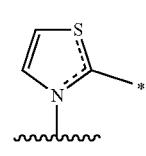 L-92
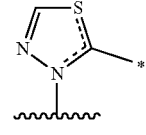 L-93
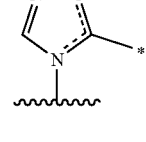 L-94
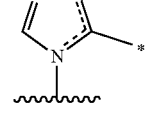 L-95
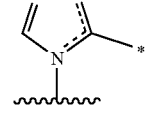 L-96
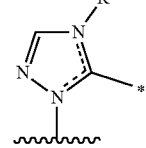 L-97

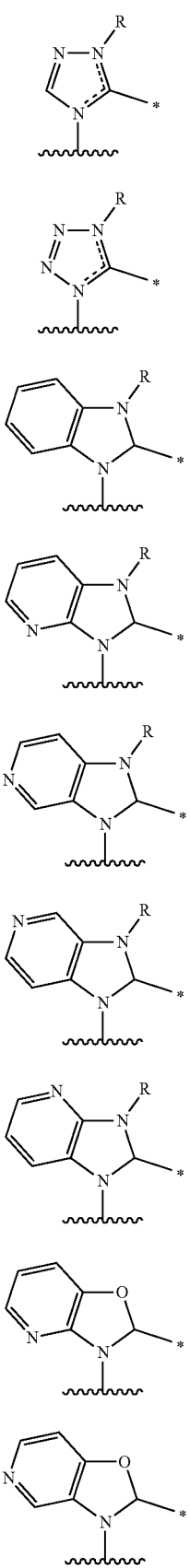
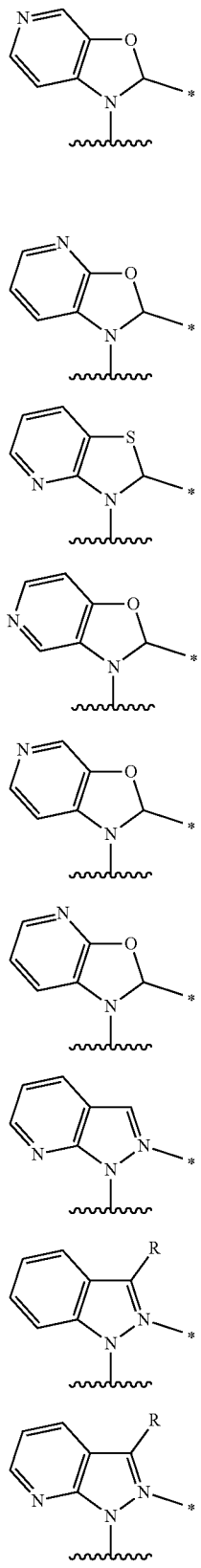

In the compounds described in Compound Group L, the same explanation on R referring to Formula L-a and Formula L-b may be applied.

Meanwhile, Formula 1 may be represented by Formula 2 below. Formula 2 corresponds to an organometallic compound where the central metal atom M is Pt.

Formula 2

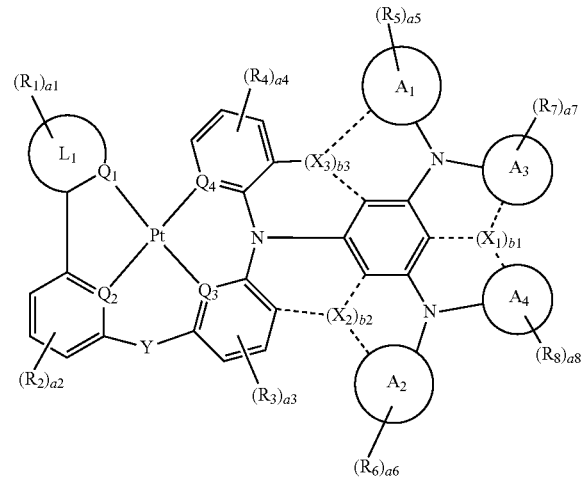

In addition, the organometallic compound of an embodiment may be represented by the following Formula 2-A:

Formula 2-A

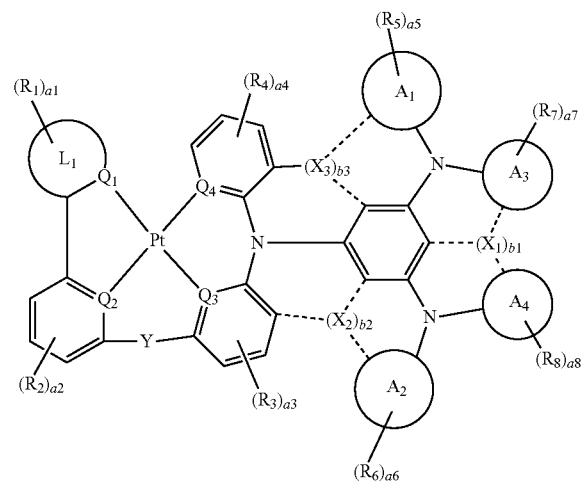

In Formula 2 and Formula 2-A, the same explanation on Y, $L_1$ to $L_4$, $Q_1$ to $Q_4$, $b_1$ to b3, $X_1$ to $X_3$, $A_1$ to $A_4$, $R_1$ to $R_8$, and a1 to a8 referring to Formula 1 may be applied.

In addition, the organometallic compound of an embodiment may be represented by the following Formula A:

Formula A

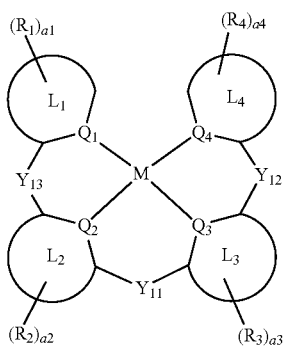

In Formula A, M is a transition metal, $Q_1$ to $Q_4$ are each independently C or N, $L_1$ to $L_4$ are each independently a substituted or unsubstituted hydrocarbon ring of 5 to 30 carbon atoms for forming a ring, or a substituted or unsubstituted heterocycle of 2 to 30 carbon atoms for forming a ring.

In addition, at least one selected from among $Y_{11}$ to $Y_{13}$ is $NR_{a1}$, $BR_{b1}$, $CR_{c1}R_{d1}$, or $SiR_{e1}R_{f1}$, and the remainder are each independently a direct linkage, O, S, Se, $SO_2$, $NR_a$, $BR_b$, $CR_cR_d$, or $SiR_eR_f$, and Rat $R_{b1}$, $R_{c1}$, and $R_{e1}$ are substituted or unsubstituted condensed rings having three or more rings and containing at least one B as a ring-forming atom. For example, $R_{a1}$, $R_{b1}$, $R_{c1}$, and $R_{e1}$ may include an azaborine moiety.

$R_1$ to $R_4$, $R_a$ to $R_f$, $R_{d1}$, and $R_{f1}$ are each independently a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and optionally are combined with an adjacent group to form a ring, and a1 to a4 are each independently an integer of 0 to 3.

In the organometallic compound of an embodiment, represented by Formula A, with respect to M, $Q_1$ to $Q_4$, $R_1$ to $R_4$, and a1 to a4, the same explanation on the organometallic compound represented by Formula 1 may be applied.

In the organometallic compound according to an embodiment, represented by Formula A, $Y_{11}$ to $Y_{13}$ of a ligand compound combined with M which is the metal atom correspond to linkers connecting adjacent rings from each other. In the organometallic compound of an embodiment, at least one selected from among $Y_{11}$ to $Y_{13}$ may be substituted with a condensed ring group including boron (B) as a ring-forming atom. The condensed ring group combined with at least one of $Y_{11}$ to $Y_{13}$ linkers includes at least one B as a ring-forming atom, and may be a condensed ring group obtained by condensing three or more rings.

For example, in Formula A, $Y_{11}$ and $Y_{13}$ may be each independently a direct linkage, O, S, Se, $SO_2$, $NR_a$, $BR_b$, $CR_cR_d$, or $SiR_eR_f$. In addition, $Y_{12}$ may be $NR_{a1}$, $BR_{b1}$, $CR_{c1}R_{d1}$, or $SiR_{e1}R_{f1}$. In some embodiments, $Y_{12}$ may be a part substituted with a condensed ring group containing B. However, an embodiment of the present disclosure is not limited thereto, and in Formula A, the part substituted with a condensed ring group containing B may be $Y_{11}$ or $Y_{13}$. In addition, in Formula A, the part substituted with a condensed ring group containing B may be two selected from among $Y_{11}$, $Y_{12}$ and $Y_{13}$.

In some embodiments, in Formula A, $Y_{11}$ may be O or $NR_a$, $Y_{13}$ may be a direct linkage, and $Y_{12}$ may be $NR_{a1}$. $R_a$ may be a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring. In addition, $R_a$ may be combined with a substituent $R_2$ which is substituted at adjacent $L_2$ to form a substituted or unsubstituted heterocycle of 2 to 20 carbon atoms for forming a ring.

In addition, in Formula A, $R_{a1}$ may be a condensed ring group of three or more rings, including B as a ring-forming atom.

Formula A may be represented by any one selected from among the following Formula A-1 to Formula A-3:

Formula A-1

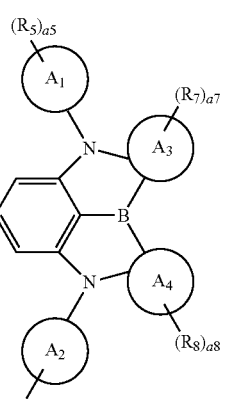

Formula A-2

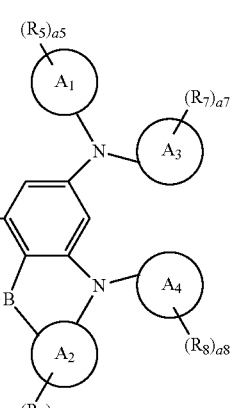

Formula A-3

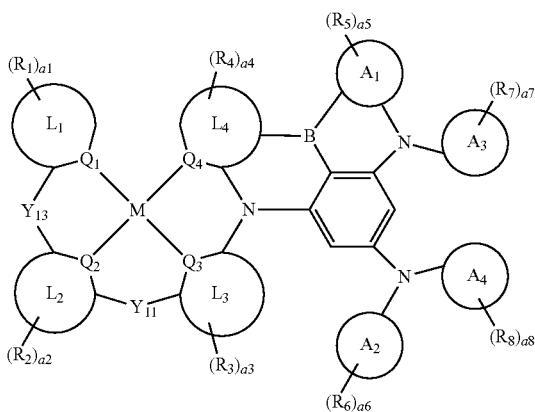

In Formula A-1 to Formula A-3, $A_1$ to $A_4$ are each independently a substituted or unsubstituted hydrocarbon ring of 5 to 30 carbon atoms for forming a ring, or a substituted or unsubstituted heterocycle of 2 to 30 carbon atoms for forming a ring, $R_5$ to $R_8$ are each independently a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, and optionally are combined with an adjacent group to form a ring. In addition, a5 to a8 are each independently an integer of 0 to 3.

Meanwhile, with respect to $A_1$ to $A_4$, $R_5$ to $R_8$, and a5 to a8, the same explanation referring to an embodiment of the organometallic compound represented by Formula 1 may be applied.

In addition, in Formula A-1 to Formula A-3, with respect to M, $Y_{11}$, $Y_{13}$, $Q_1$ to $Q_4$, $L_1$ to $L_4$, $R_1$ to $R_4$, and a1 to a4, the same explanation referring to Formula A may be applied.

The organometallic compound of an embodiment, represented by Formula 1 or Formula A may be a light-emitting dopant which emits blue light. In addition, the organometallic compound of an embodiment, represented by Formula 1 or Formula A may be a phosphorescence dopant.

The organometallic compound represented by Formula 1 or Formula A in an embodiment may be represented by any one selected from among the compounds represented in Compound Group 1 below. The emission layer EML may include at least one selected from among the compounds represented in Compound Group 1 below.

Compound Group 1
1
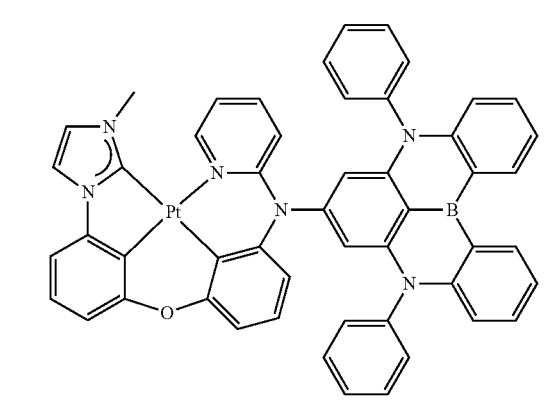
2
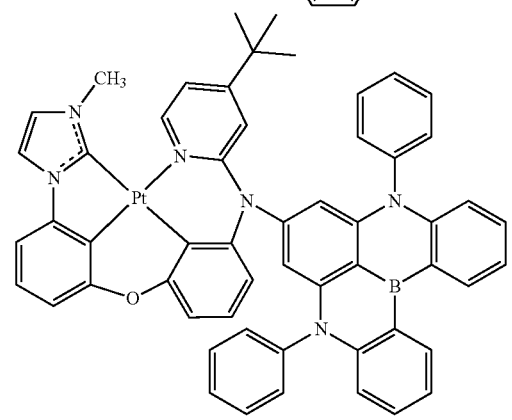
3
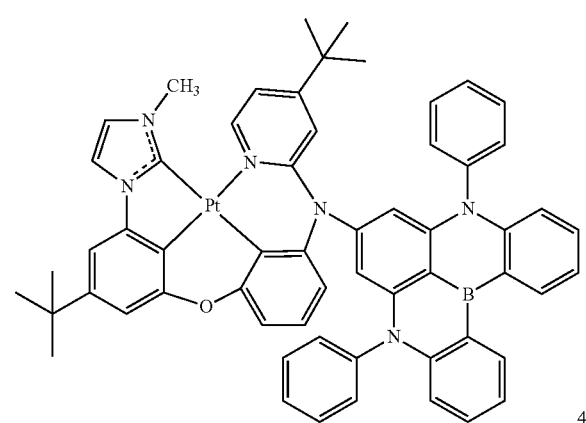
4
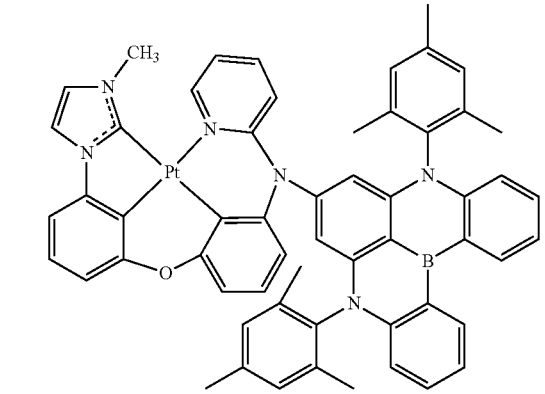
5
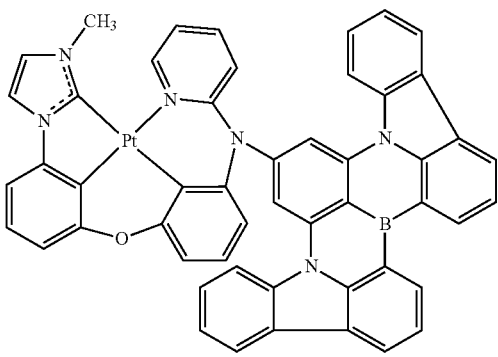
6
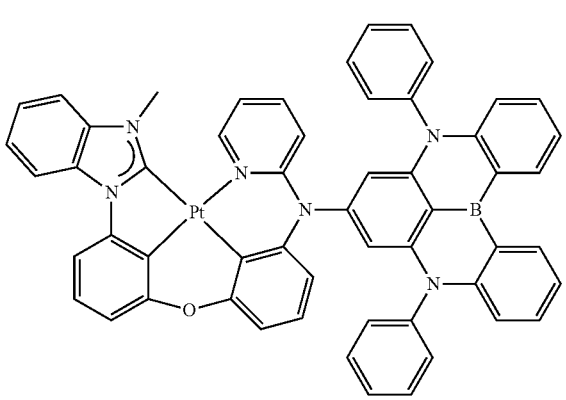
7
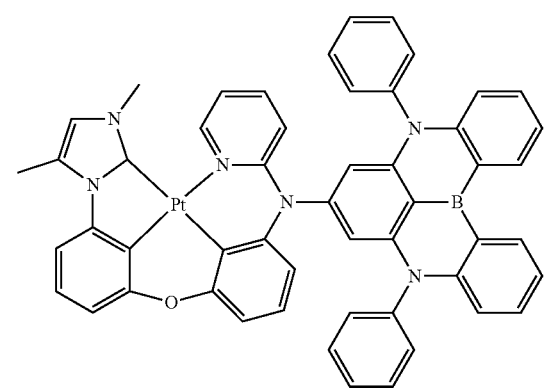
8
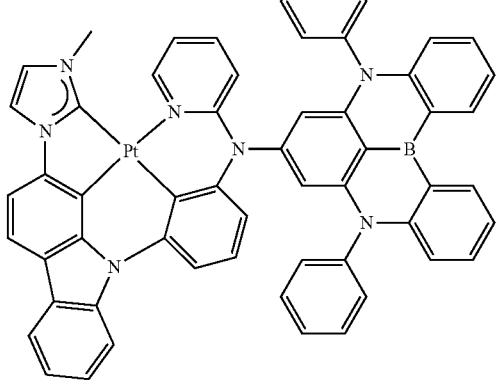

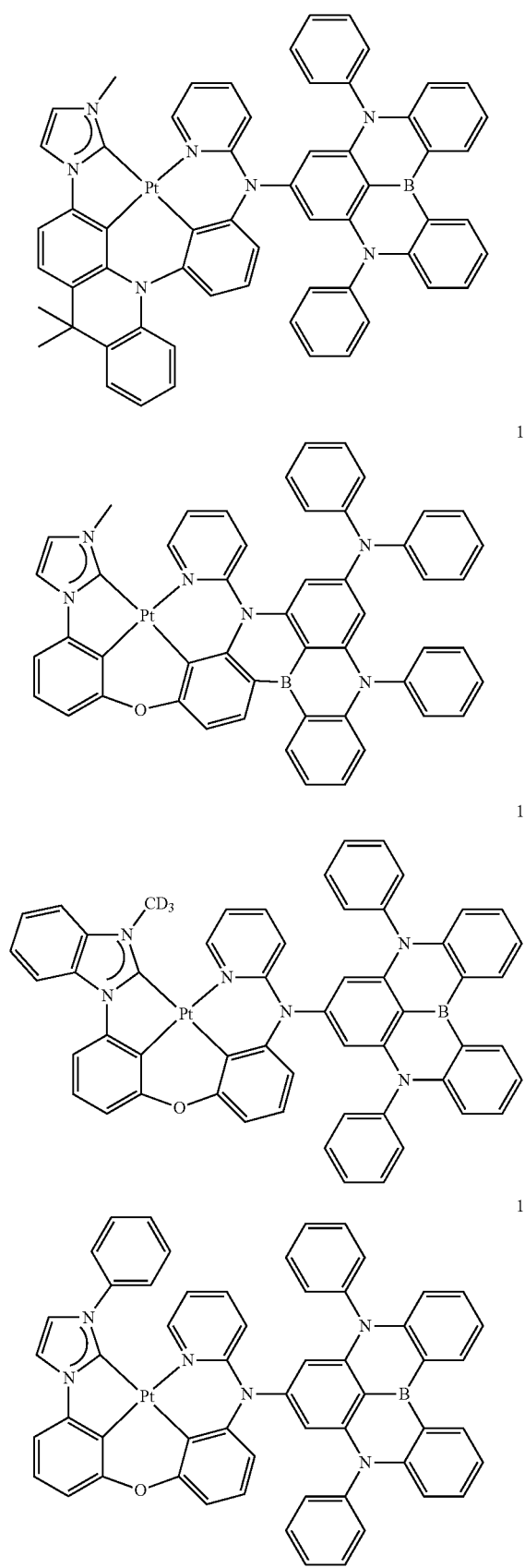
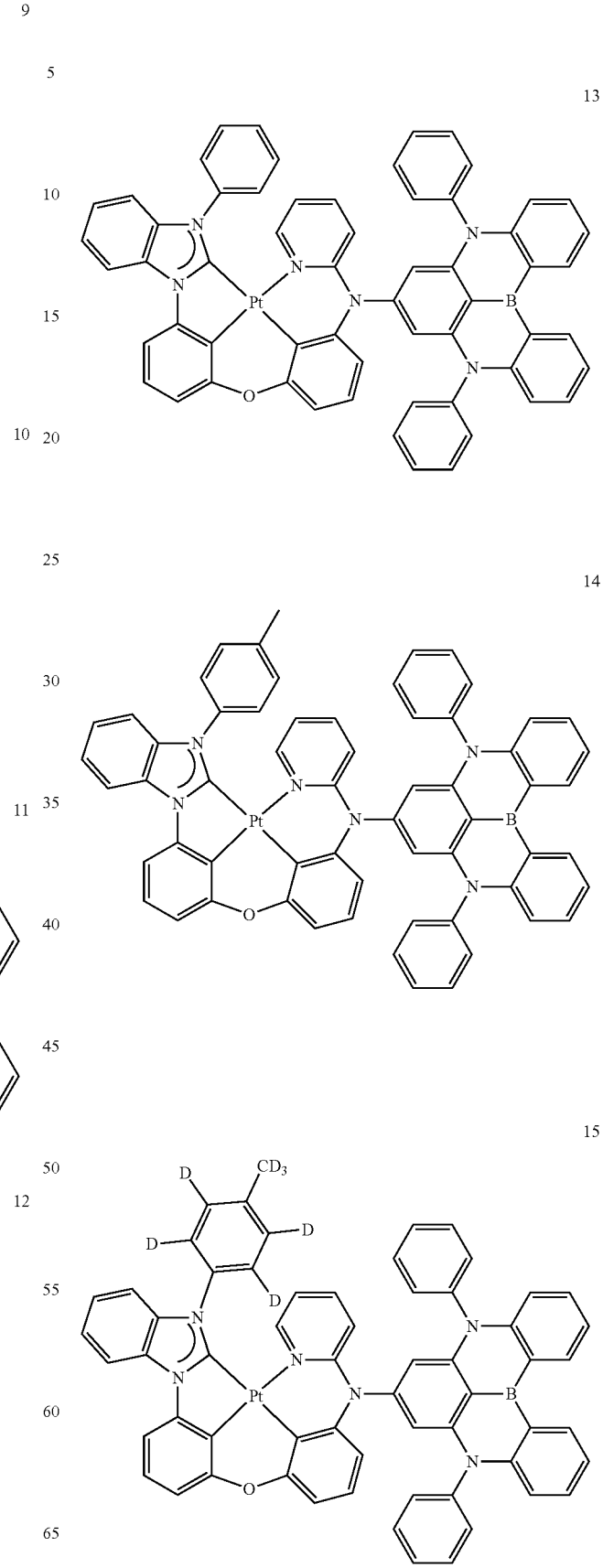

16
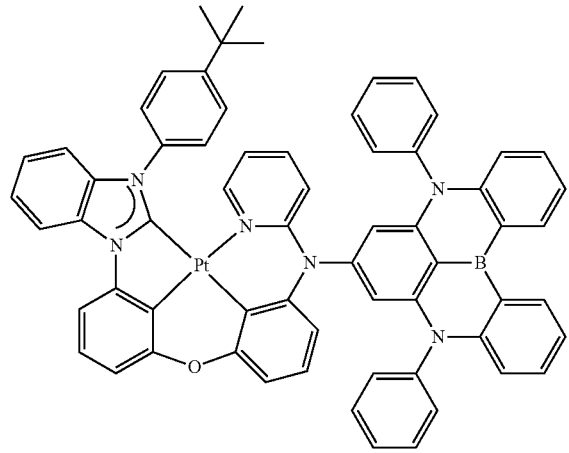
17
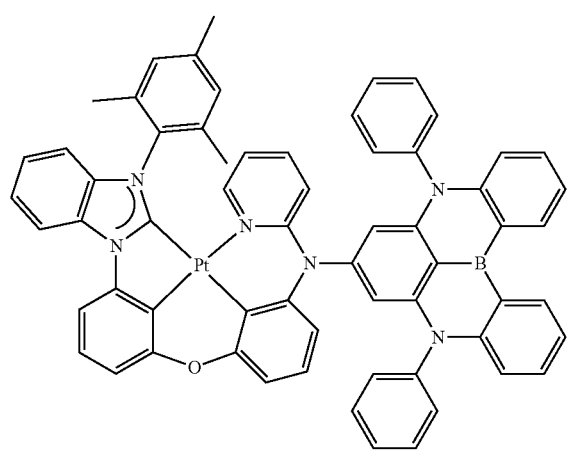
18
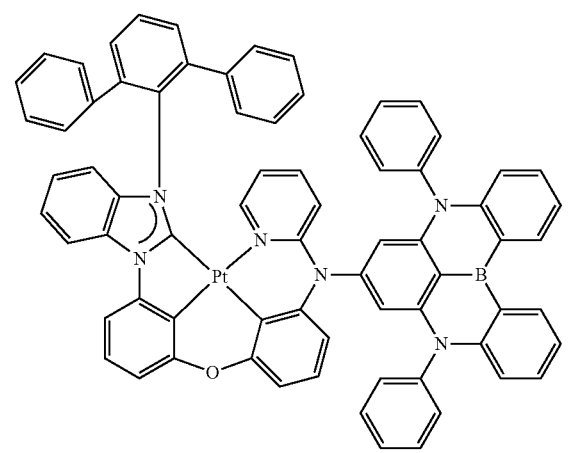
19
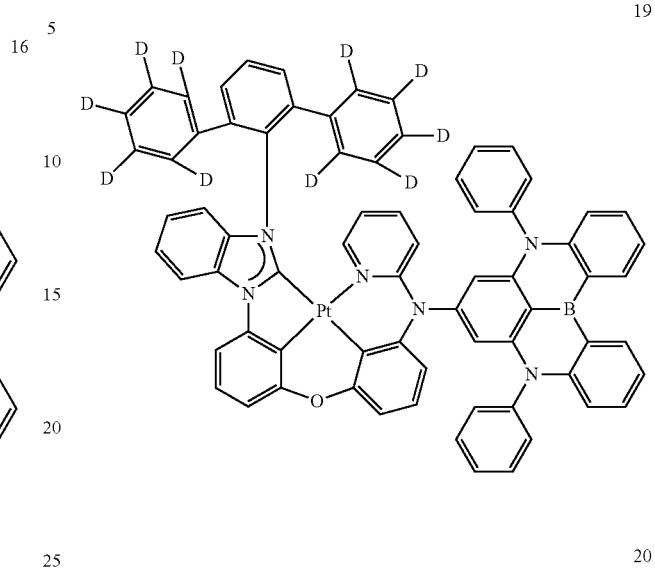
20
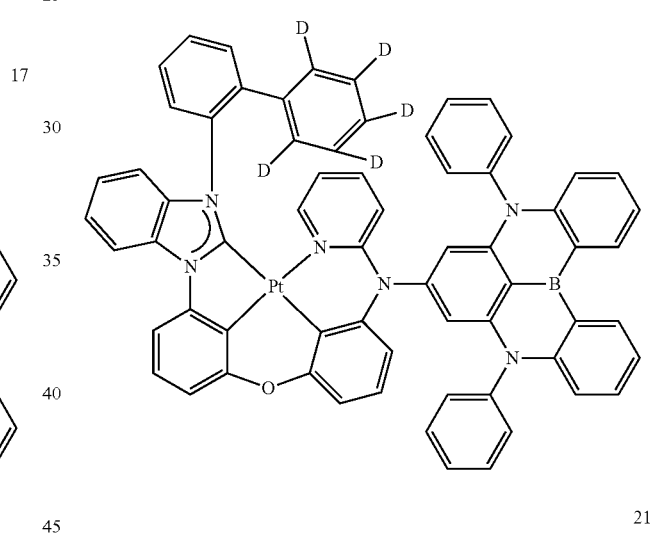
21
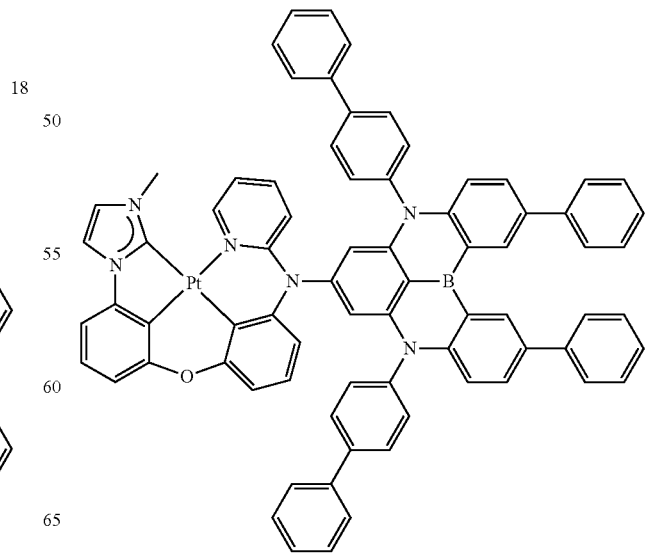

-continued

22

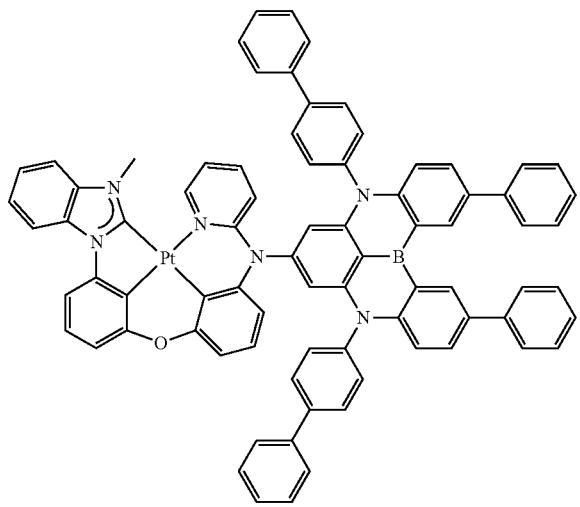

23

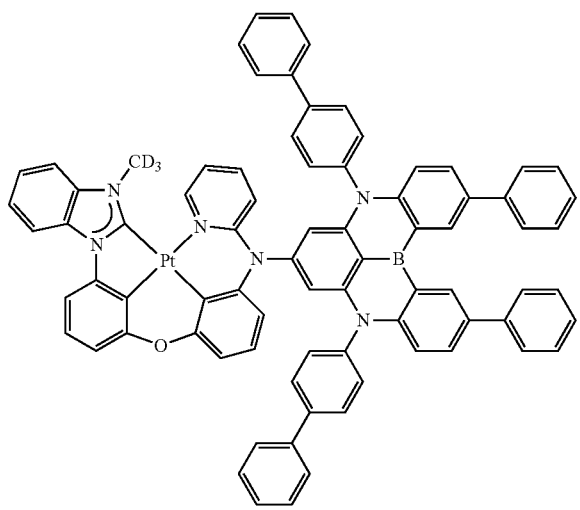

In the particular compounds shown in Compound Group 1, "D" corresponds to a deuterium atom.

In the organic electroluminescence device 10 of an embodiment, the emission layer EML includes the organometallic compound according to an embodiment, which has a metal complex and a condensed ring group containing boron (B) as a ring-forming atom, and may show improved emission efficiency properties. The organometallic compound according to an embodiment has a hybrid structure in which a metal complex and a condensed ring group containing B are combined, and may show a higher $^3$MLCT ratio than an organometallic compound not including a condensed ring group containing B.

Meanwhile, in the organic electroluminescence devices 10 of embodiments as shown in FIG. 1 to FIG. 4, the emission layer EML may include a host and a dopant, and the emission layer EML may include the organometallic compound represented by Formula 1 or Formula A as a dopant material.

In an embodiment, the emission layer EML may emit phosphorescence. For example, the organometallic compound according to an embodiment, represented by Formula 1 or Formula A may be a phosphorescence dopant.

Meanwhile, the emission layer EML may further include a host material in addition to the organometallic compound of an embodiment. In the organic electroluminescence device 10 of an embodiment, the emission layer EML may include any suitable materials generally used in the art as the host material, without limitation. For example, at least one selected from among bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4', 4"-tris (carbazol-9-yl) triphenylamine (TCTA) and 1,3,5-tris(1-phenyl-1H-benzo[d]imidazol-2-yl)benzene (TPBi) may be included. However, an embodiment of the present disclosure is not limited thereto. For example, tris(8-hydroxyquinolino) aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(N-phenylbenzimidazol-2-yl)benzene (TPBi), 2-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH$_2$), hexaphenylcyclotrisiloxane (DPSiO$_3$), octaphenylcyclotetra siloxane (DPSiO$_4$), 2,8-bis(diphenylphosphoryl)dibenzo[b,d]furan (PPF), bis(4-(9H-carbazol-9-yl)phenyl)diphenylsilane (BCPDS), (4-(1-(4-(diphenylamino)phenyl)cyclohexyl)phenyl)diphenylphosphine oxide (POPCPA), etc., may be used as the host material.

In addition, the emission layer EML of the organic electroluminescence device 10 of an embodiment may further include any suitable dopant material generally available in the art in addition to the organometallic compound. For example, the emission layer EML may further include any suitable fluorescence dopant material generally available in the art, any suitable delayed fluorescence dopant material generally available in the art, and/or any suitable phosphorescence dopant material generally available in the art.

In some embodiments, the organic electroluminescence device 10 of an embodiment may include a plurality of emission layers. The plurality of emission layers may be provided by stacking the layers in order. For example, an organic electroluminescence device 10 including a plurality of emission layers may emit white light. The organic electroluminescence device 10 including a plurality of emission layers may be an organic electroluminescence device of a tandem structure. In case where an organic electroluminescence device 10 includes a plurality of emission layers, at least one emission layer may include the above-described organometallic compound of an embodiment.

In the organic electroluminescence devices 10 of an embodiment, shown in FIG. 1 to FIG. 4, an electron transport region ETR is provided on an emission layer EML. The electron transport region ETR may include at least one selected from a hole blocking layer HBL, an electron transport layer ETL, and an electron injection layer EIL. However, an embodiment of the present disclosure is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. Further, the electron transport region ETR may have a single layer structure having a plurality of different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. The electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), or a mixture thereof, without limitation. The thickness of the electron transport layer ETL may be from about 100 Å to about 1,000 Å and may be, for example, from about 150 Å to about 500 Å. If the thickness of the electron transport layer ETL satisfies the above-described range, suitable or satisfactory electron transport properties may be obtained without substantial increase of a driving voltage.

If the electron transport region ETR includes the electron injection layer EIL, the electron transport region ETR may include, a metal halide such as LiF, NaCl, CsF, RbCl, RbI, and/or CuI, a metal of the lanthanides such as Yb, a metal oxide such as $Li_2O$ and/or BaO, and/or hydroxyquinolinato-lithium (LiQ). However, embodiments of the present disclosure is not limited thereto. The electron injection layer EIL also may be formed using a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, and/or metal stearates. The thickness of the electron injection layer EIL may be from about 1 Å to about 100 Å, and from about 3 Å to about 90 Å. If the thickness of the electron injection layer EIL satisfies the above described range, suitable or satisfactory electron injection properties may be obtained without inducing substantial increase of a driving voltage.

The electron transport region ETR may include a hole blocking layer HBL as described above. The hole blocking layer HBL may include, for example, at least one of 2,9-dimethyl-4,7-diphenyl-1,10-phenanthroline (BCP), and 4,7-diphenyl-1,10-phenanthroline (Bphen). However, an embodiment of the present disclosure is not limited thereto.

The second electrode EL2 is provided on the electron transport region ETR. The second electrode EL2 may be a common electrode or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using the above-described materials and a transparent conductive layer formed using ITO, IZO, ZnO, ITZO, etc.

In some embodiments, the second electrode EL2 may be connected with an auxiliary electrode. If the second electrode EL2 is connected with the auxiliary electrode, the resistance of the second electrode EL2 may decrease.

Referring to FIG. 4, on the second electrode EL2 of the organic electroluminescence device 10 of an embodiment, a capping layer CPL may be further included. The capping layer CPL may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4''-tris(carbazol-9-yl) triphenylamine (TCTA), etc.

The organic electroluminescence device 10 according to an embodiment of the present disclosure includes an organometallic compound which is substituted with a condensed ring group containing boron (B) as a ring-forming atom in an emission layer EML as described above, and may show excellent emission efficiency properties.

Hereinafter, the compound according to an embodiment of the present disclosure and the organic electroluminescence device of an embodiment will be particularly explained referring to embodiments and comparative embodiments. The following embodiments are only illustrations to assist the understanding of the subject matter of the present disclosure, and the scope of the present disclosure is not limited thereto.

EXAMPLES

1. Synthesis of Organometallic Compound

The organometallic compound according to an embodiment of the present disclosure may be prepared, for example, as follows. However, the synthetic method of the organometallic compound according to an embodiment of the present disclosure is not limited thereto.

(1) Synthesis of Organometallic Compound 1

Organometallic Compound 1 according to an embodiment may be synthesized by the steps suggested in the following Reaction 1:

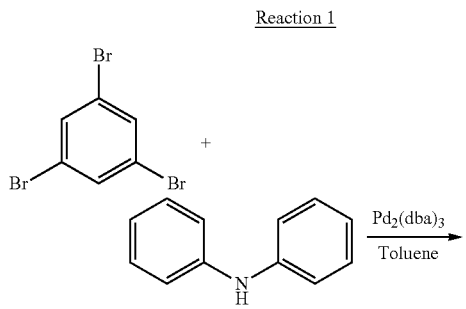

Reaction 1

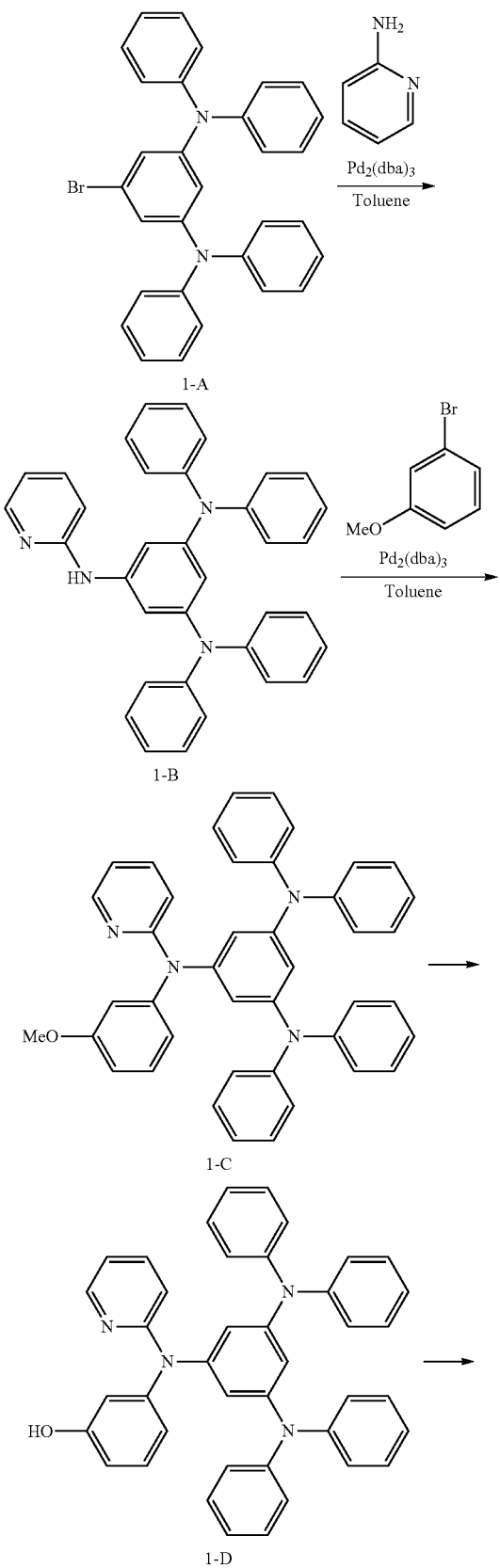
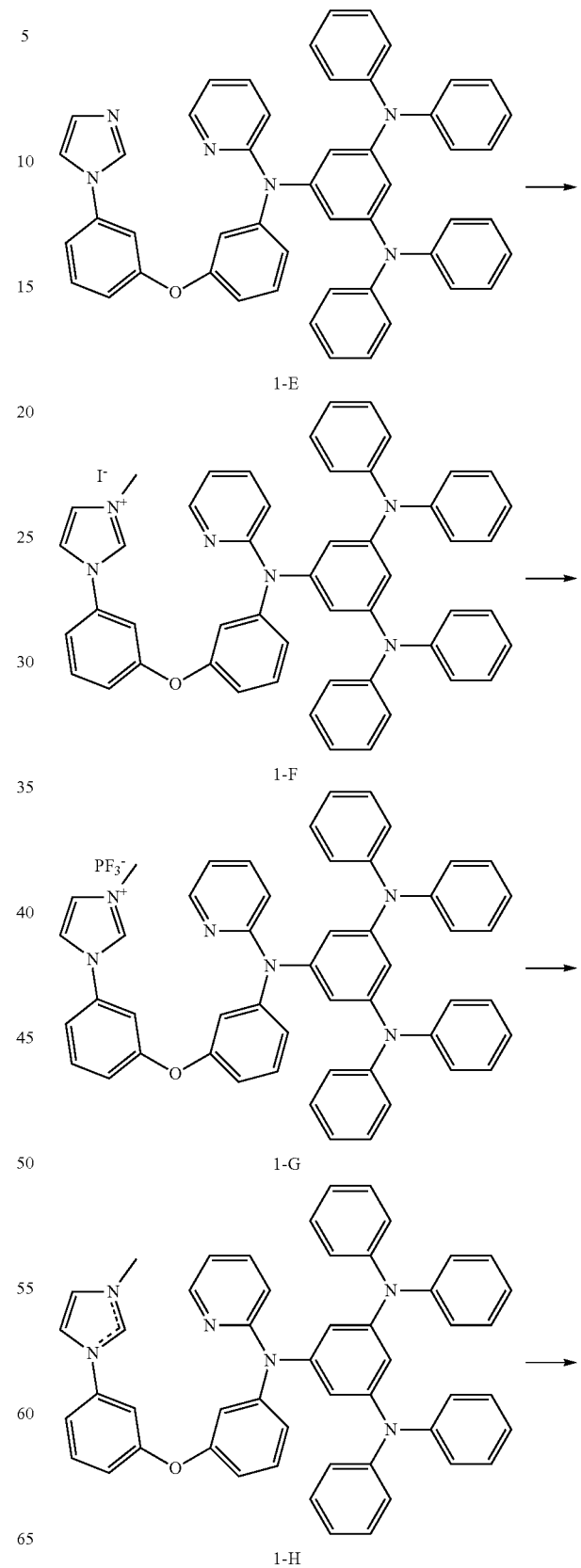

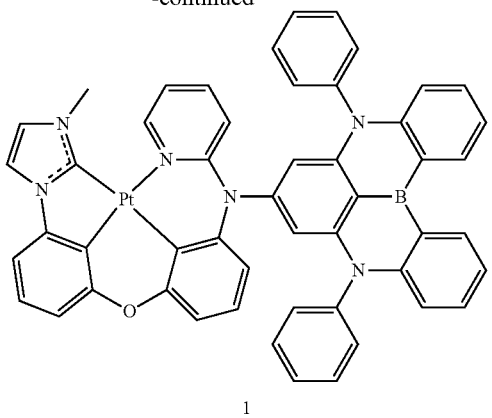

1

Synthesis of Intermediate Compound 1-A 1,3,5-tribromobenzene (1 eq), diphenylamine (2.5 eq), tris(dibenzylideneacetone)dipalladium (Pd$_2$(dba)$_3$) (0.02 eq), and NaOt-Bu (3 eq) were suspended in dioxane (0.1 M), followed by elevating the temperature to about 100° C. and stirring for about 12 hours to form a reaction mixture. The reaction mixture was extracted with dichloromethane and distilled water. An organic layer was washed with distilled water three times, dried with anhydrous magnesium sulfate, filtered and concentrated under a reduced pressure to form a concentrated solution. The concentrated solution was separated by column chromatography to obtain Intermediate 1-A in 70% yield.

Synthesis of Intermediate 1-B

Intermediate 1-A (1 eq), 2-aminopyridine (1.2 eq), tris (dibenzylideneacetone)dipalladium (0.02 eq), and NaOt-Bu (1.5 eq) were suspended in dioxane (0.1 M), followed by elevating the temperature to about 100° C. and stirring for about 12 hours to form a reaction mixture. The reaction mixture was extracted with dichloromethane and distilled water. An organic layer was washed with distilled water three times, dried with anhydrous magnesium sulfate, filtered and concentrated under a reduced pressure to form a concentrated solution. The concentrated solution was separated by column chromatography to obtain Intermediate 1-B in 80% yield.

Synthesis of Intermediate Compound 1-C

Intermediate 1-B (1 eq), 1-bromo-3-methoxybenzene (1.2 eq), tris(dibenzylideneacetone)dipalladium (0.02 eq), and NaOt-Bu (1.5 eq) were suspended in dioxane (0.1 M), followed by elevating the temperature to about 100° C. and stirring for about 12 hours to form a reaction mixture. The reaction mixture was extracted with dichloromethane and distilled water. An organic layer was washed with distilled water three times, dried with anhydrous magnesium sulfate, filtered and concentrated under a reduced pressure to form a concentrated solution. The concentrated solution was separated by column chromatography to obtain Intermediate 1-C in 75% yield.

Synthesis of Intermediate 1-D

Intermediate 1-C was suspended using HBr (0.5 M) and acetic acid (0.5 M), followed by elevating the temperature to about 120° C. and stirring for about 12 hours to form a reaction mixture. The reaction mixture was neutralized with an aqueous solution of 0.3 M NaOH, and the solid thus produced was filtered. The solid thus filtered was extracted with dichloromethane and distilled water. An organic layer was washed with distilled water three times, dried with anhydrous magnesium sulfate, filtered and concentrated under a reduced pressure to form a concentrated solution. The concentrated solution was separated by column chromatography to obtain Intermediate 1-D in 75% yield.

Synthesis of Intermediate Compound 1-E

Intermediate 1-D (1.0 eq), 1-(3-bromophenyl)-1H-imidazole (1.0 eq), copper iodide (0.1 eq), potassium phosphate (2.0 eq), and L-proline (0.1 eq) were suspended in 100 ml of dimethyl formamide, followed by elevating the temperature to about 120° C. and stirring for about 12 hours to form a reaction mixture. The reaction mixture was extracted with dichloromethane and distilled water. An organic layer was washed with distilled water three times, dried with anhydrous magnesium sulfate, filtered and concentrated under a reduced pressure to form a concentrated solution. The concentrated solution was separated by column chromatography to obtain Intermediate 1-E in 70% yield.

Synthesis of Intermediate 1-F

Intermediate 1-E was dissolved in acetone, and iodomethane (2 eq) was added thereto, followed by stirring at room temperature for about 24 hours. After finishing the reaction, solvents were removed under a reduced pressure to form a concentrated solution, and the concentrated solution was separated by column chromatography to obtain Intermediate 1-F in 80% yield.

Synthesis of Intermediate 1-G

Intermediate 1-F was dissolved in a mixture solvent of methanol and distilled water to a volume ratio of 4:1, and ammonium hexafluorophosphate (2 eq) was added thereto. The solid thus produced was stirred at room temperature for about 12 hours. The solid was filtered and washed with distilled water and diethyl ether to obtain Intermediate 1-G in 90% yield.

Synthesis of Intermediate 1-H

Intermediate 1-G (1.0 eq), sodium acetate (3.0 eq), and dichloro(1,5-cyclooctadiene)platinum(II) (1.1 eq) were suspended in 1,4-dioxane solvent. The temperature of the reaction mixture was elevated to about 120° C. and stirring was carried out for about 12 hours. After finishing the reaction, solvents were removed under a reduced pressure to form a concentrated solution. Through the separation of the concentrated solution using column chromatography, Intermediate 1-H was obtained in 40% yield.

Synthesis of Organometallic Compound 1

Intermediate 1-H (1.0 eq) was dissolved in ortho-dichlorobenzene and then cooled to 0° C. under a nitrogen atmosphere. BBr$_3$ (16 eq) was slowly injected, the temperature was elevated to about 150° C. and stirring was carried out for about 24 hours to form a reaction product. After cooling, triethylamine was slowed dropped to the reaction product to terminate activity, and then, the reaction product was dropped into ethyl alcohol for precipitation, and through filtering a precipitated solid was obtained. The solid thus obtained was silica-filtered using toluene and then separated through recrystallization using toluene again to obtain Organometallic Compound 1 in 20% yield.

(2) Synthesis of Organometallic Compound 2

Organometallic Compound 2 was obtained by using substantially the same method as the synthetic example of Organometallic Compound 1 except for using 4-(tert-butyl)pyridin-2-amine instead of 2-aminopyridine during the synthesizing process of Intermediate 1-B in the synthetic example of Organometallic Compound 1.

(3) Synthesis of Organometallic Compound 3

Organometallic Compound 3 was obtained by using substantially the same method as the synthetic example of Organometallic Compound 1 except for using 4-(tert-butyl)

pyridin-2-amine instead of 2-aminopyridine during the synthesizing process of Intermediate 1-B and using 1-(3-bromo-5-(tert-butyl)phenyl)-1H-imidazole instead of 1-(3-bromophenyl)-1H-imidazole during the synthesizing process of Intermediate 1-E in the synthetic example of Organometallic Compound 1.

(4) Synthesis of Organometallic Compound 4

Organometallic Compound 4 was obtained by using substantially the same method as the synthetic example of Organometallic Compound 1 except for using 2,4,6-trimethyl-N-phenylaniline instead of the reactant diphenylamine.

(5) Synthesis of Organometallic Compound 5

Organometallic Compound 5 was obtained by using substantially the same method as the synthetic example of Organometallic Compound 1 except for using carbazole instead of the reactant diphenylamine.

(6) Synthesis of Organometallic Compound 6

Organometallic Compound 6 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E.

(7) Synthesis of Organometallic Compound 7

Organometallic Compound 7 was obtained by using substantially the same method as the synthetic example of Organometallic Compound 1 except for using 1-(3-bromophenyl)-3,5-dimethyl-2,3-dihydro-1H-pyrazole instead of 1-(3-bromophenyl)-1H-imidazole in the synthetic step of Intermediate 1-E.

(8) Synthesis of Organometallic Compound 8

Organometallic Compound 8 was obtained by using substantially the same method as the synthetic example of Organometallic Compound 1 except for using 2-(3-methyl-2,3-dihydro-1H-imidazol-1-yl)-9H-carbazole instead of 1-(3-bromophenyl)-1H-imidazole in the synthetic step of Intermediate 1-E.

(9) Synthesis of Organometallic Compound 9

Organometallic Compound 9 was obtained by using substantially the same method as the synthetic example of Organometallic Compound 1 except for using 9,9-dimethyl-3-(3-methyl-2,3-dihydro-1H-imidazol-1-yl)-9,10-dihydroacridine instead of 1-(3-bromophenyl)-1H-imidazole in the synthetic step of Intermediate 1-E.

(10) Synthesis of Organometallic Compound 10

Intermediate 1-H (1.0 eq) was dissolved in ortho-dichlorobenzene and then cooled to 0° C. under a nitrogen atmosphere. BBr$_3$ (16 eq) was slowly injected, the temperature was elevated to about 190° C., and stirring was carried out for about 24 hours to form a reaction product. After cooling, triethylamine was slowly dropped into the reaction product to terminate activity, and then, the reaction product was dropped into ethyl alcohol for precipitation, and filtering was carried out to obtain a precipitated reaction product. The solid thus obtained was silica-filtered using toluene and then separated through recrystallization using toluene again to obtain Organometallic Compound 10 in 20% yield.

(11) Synthesis of Organometallic Compound 11

Organometallic Compound 11 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using iodomethane-d3 instead of iodomethane in the synthetic step of Intermediate 1-F.

(12) Synthesis of Organometallic Compound 12

Organometallic Compound 12 was obtained by using substantially the same method as the synthetic example of Organometallic Compound 1 except for using iodobenzene instead of iodomethane in the synthetic step of Intermediate 1-F.

(13) Synthesis of Organometallic Compound 13

Organometallic Compound 13 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using iodobenzene instead of iodomethane in the synthetic step of Intermediate 1-F.

(14) Synthesis of Organometallic Compound 14

Organometallic Compound 14 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using 1-iodo-4-methylbenzene instead of iodomethane in the synthetic step of Intermediate 1-F.

(15) Synthesis of Organometallic Compound 15

Organometallic Compound 15 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using 1-iodo-4-methylbenzene-d7 instead of iodomethane in the synthetic step of Intermediate 1-F.

(16) Synthesis of Organometallic Compound 16

Organometallic Compound 16 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using 1-(tert-butyl)-4-iodobenzene instead of iodomethane in the synthetic step of Intermediate 1-F.

(17) Synthesis of Organometallic Compound 17

Organometallic Compound 17 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using mesityl iodide instead of iodomethane in the synthetic step of Intermediate 1-F.

(18) Synthesis of Organometallic Compound 18

Organometallic Compound 18 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using 2'-iodo-1,1':3',1''-terphenyl instead of iodomethane in the synthetic step of Intermediate 1-F.

(19) Synthesis of Organometallic Compound 19

Organometallic Compound 19 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using 2'-iodo-1,1':3',1''-terphenyl-d10 instead of iodomethane in the synthetic step of Intermediate 1-F.

(20) Synthesis of Organometallic Compound 20

Organometallic Compound 20 was obtained by using substantially the same method as the synthetic example of Organometallic Compound 1 except for using 1-(3-bromophenyl)-1H-benzo[d]imidazole instead of 1-(3-bromophenyl)-1H-imidazole in the synthetic step of Intermediate 1-E, and using 2-iodo-1,1'-biphenyl-d5 instead of iodomethane in the synthetic step of Intermediate 1-F.

(21) Synthesis of Organometallic Compound 21

Organometallic Compound 21 was obtained by using substantially the same method as the synthetic example of Organometallic Compound 1 except for using di([1,1'-biphenyl]-4-yl)amine instead of the reactant diphenylamine.

(22) Synthesis of Organometallic Compound 22

Organometallic Compound 22 was obtained by using substantially the same method as the synthetic example of Organometallic Compound 1 except for using di([1,1'-biphenyl]-4-yl)amine instead of the reactant diphenylamine, and using 1-(3-bromophenyl)-1H-benzo[d]imidazole instead of 1-(3-bromophenyl)-1H-imidazole in the synthetic step of Intermediate 1-E.

(23) Synthesis of Organometallic Compound 23

Organometallic Compound 23 was obtained by using substantially the same method as the synthetic example of Organometallic Compound 1 except for using di([1,1'-biphenyl]-4-yl)amine instead of the reactant diphenylamine, using 1-(3-bromophenyl)-1H-benzo[d]imidazole instead of 1-(3-bromophenyl)-1H-imidazole in the synthetic step of Intermediate 1-E, and using iodomethane-d3 instead of iodomethane in the synthetic step of Intermediate 1-F.

2. Evaluation of Properties of Organometallic Compound

The light-emitting properties of the organometallic compounds of Example Compounds 1, 3, 6, 10, 15 and 20 and Comparative Compound C1 were evaluated and shown in Table 1 below.

The Example Compounds and Comparative Compound C1 are as follows.

Example Compounds

1

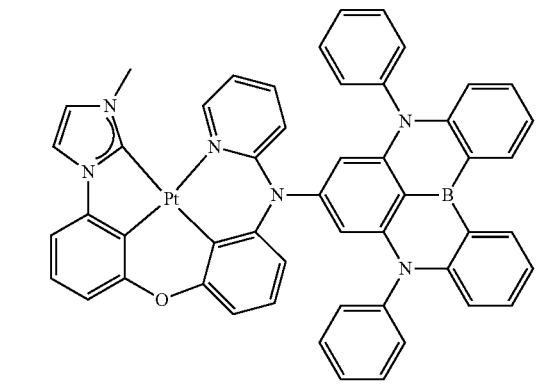

3

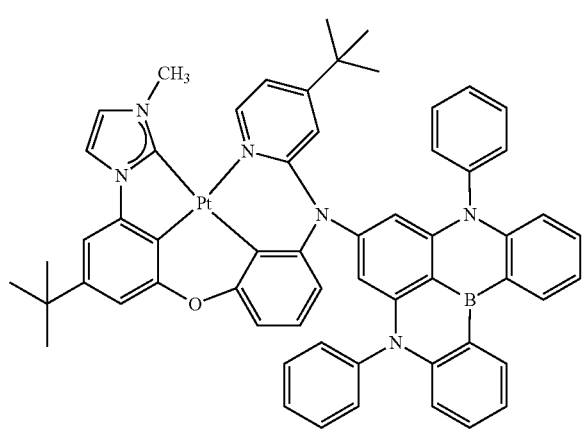

-continued

6

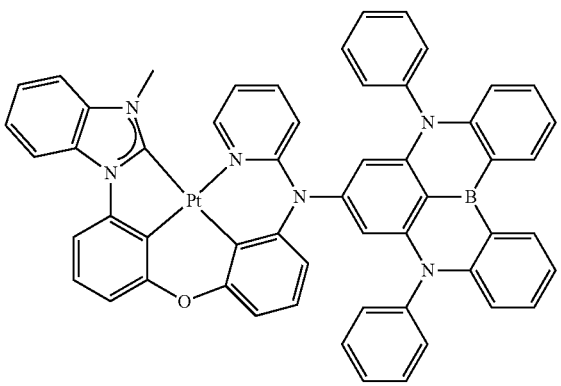

10

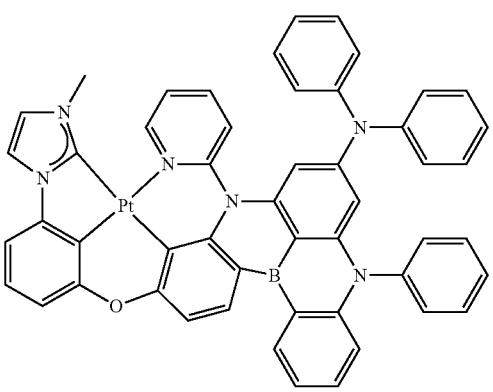

15

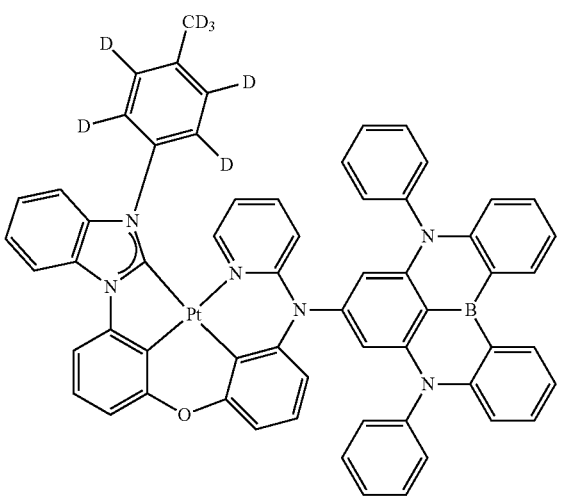

-continued

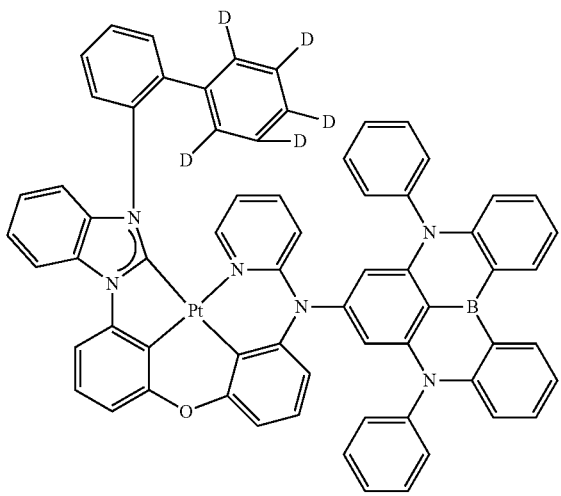

Comparative Compound C1

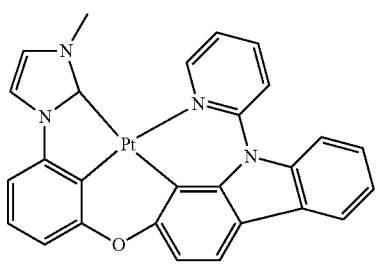

C1

TABLE 1

| Kind of compound | $^3$MLCT (ratio) | $\lambda_{max}^{exp}$ (nm) | $^3$MC (eV) | Bond dissociation energy (kcal/mol) |
| --- | --- | --- | --- | --- |
| Organometallic Compound 1 | 10.9% | 455 | 0.82 | 30.5 |
| Organometallic Compound 3 | 10.1% | 453 | 0.85 | 35.0 |
| Organometallic Compound 6 | 15.2% | 450 | 0.90 | 36.9 |
| Organometallic Compound 10 | 11.5% | 460 | 0.80 | 34.0 |
| Organometallic Compound 15 | 16.0% | 450 | 0.90 | 38.0 |
| Organometallic Compound 20 | 13.2% | 452 | 0.86 | 37.2 |
| Comparative Compound C1 | 10.1% | 463 | 0.70 | 30.0 |

It can be seen from Table 1 that Organometallic Compounds 1, 3, 6, 10, 15 and 20, which are the Example Compounds, showed a similar degree of increased metal to ligand charge transfer ($^3$MLCT) ratio values when compared with Comparative Compound C1. In addition, it can be seen that the organometallic compounds of the Examples showed an increased 3 metal centered state ($^3$MC) energy and an increased bond dissociation energy when compared with Comparative Compound C1. Accordingly, improved device life and emission efficiency properties may be exhibited if the organometallic compounds of the Examples are included in a display device when compared with a case of a display device including the Comparative Compound C1.

The $\lambda_{max}^{exp}$ which is the luminescence central wavelength of Organometallic Compounds 1, 3, 6, 10, 15 and 20 of the Examples corresponds to a shorter wavelength region when compared with the luminescence central wavelength of Comparative Compound C1. For example, from the results of Table 1, it can be seen that the Example Compounds emit deep blue light, which is blue light in a shorter wavelength region when compared with Comparative Compound C1.

3. Manufacture and Evaluation of Organic Electroluminescence Device Manufacture of Organic Electroluminescence Device The organic electroluminescence device of an embodiment, including the organometallic compound of an embodiment was manufactured as follows.

Manufacture of Example 1

A glass substrate on which ITO with 15 Ω/cm² (1200 Å) of Corning Co. was formed was cut into a size of 50 mm×50 mm×0.7 mm as a substrate and a first electrode (anode), washed by ultrasonic waves using isopropyl alcohol and pure water for 5 minutes, respectively, exposed to ultraviolet rays and ozone for about 30 minutes for washing, and the glass substrate was installed in a vacuum deposition apparatus.

On the ITO anode formed on the glass substrate, 2-TNATA was vacuum deposited to form a hole injection layer with a thickness of about 600 Å, and NPB was vacuum deposited on the hole injection layer to form a hole transport layer with a thickness of about 300 Å.

On the hole transport layer, BCPDS and POPCPA (the weight ratio of BCPDS and POPCPA were 1:1), which were co-host, and Organometallic Compound 1 as a dopant were co-deposited such that the weight ratio of the co-host and the dopant became 90:10 to form an emission layer with a thickness of about 300 Å.

On the emission layer, TSPO1 was deposited to form a hole blocking layer with a thickness of about 50 Å, on the hole blocking layer, Alq$_3$ was deposited to form an electron transport layer with a thickness of about 300 Å, and on the electron transport layer, LiF was deposited to form an electron injection layer with a thickness of about 10 Å. Then, Al was deposited on the electron injection layer to form a second electrode (cathode) with a thickness of about 3,000 Å, and an organic electroluminescence device was manufactured.

The compounds used for the manufacture of the organic electroluminescence device are shown below.

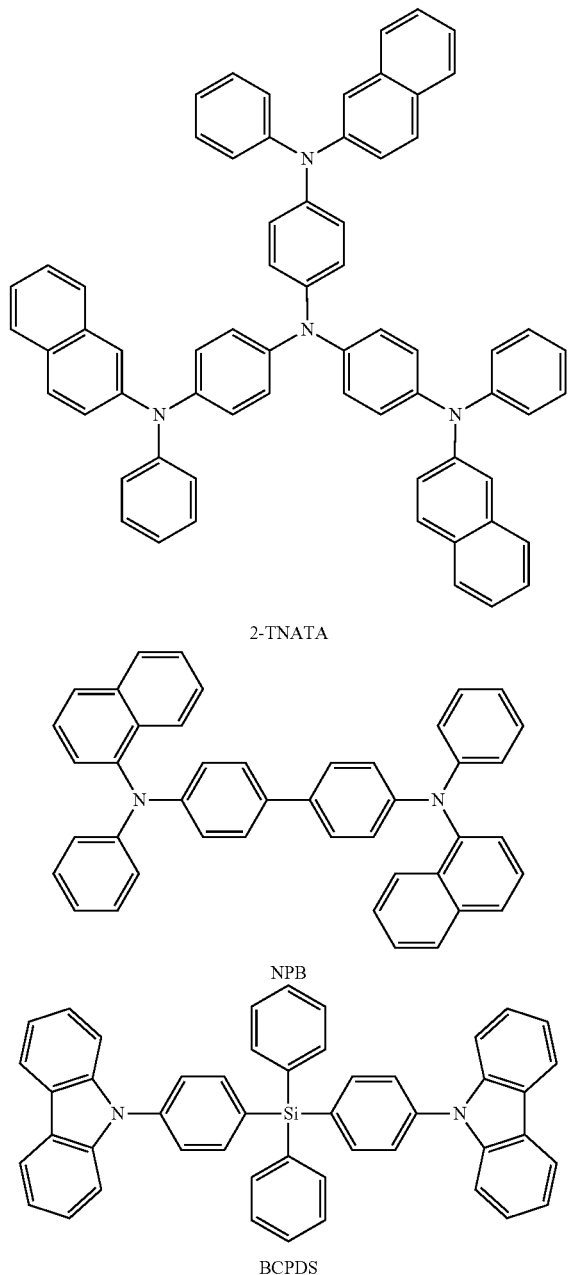

2-TNATA

NPB

BCPDS

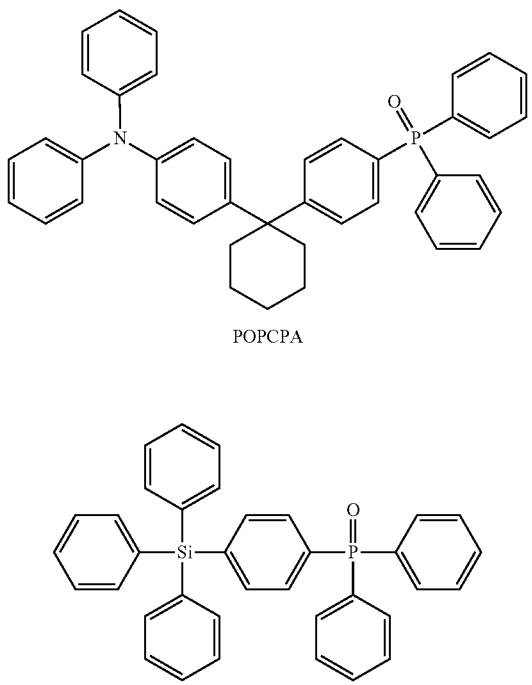

POPCPA

TSPO1

Manufacture of Examples 2 to 4 and Comparative Example 1

Organic electroluminescence devices were manufactured by using substantially the same manufacturing method as Example 1 except for using Organometallic Compounds 3, 6, and 10 and Comparative Compound C1, respectively, instead of Organometallic Compound 1 as a dopant during forming an emission layer.

Evaluation of Properties of Organic Electroluminescence Devices

The driving voltage, current density, luminance, emission efficiency and emission wavelength of the organic electroluminescence devices manufactured in Examples 1 to 4 and Comparative Example 1 were measured using a Keithley SMU 236 and a brightness photometer PR650, and time (half life) required for decreasing initial luminance to 95% was measured. The results are shown in Table 2.

TABLE 2

| Division | Emission layer material | Driving voltage | Current density (mA/cm$^2$) | Luminance (cd/m$^2$) | Emission efficiency (cd/A) | Emission wavelength (nm) | Life LT95 (h) |
|---|---|---|---|---|---|---|---|
| Example 1 | Compound 1 | 5.20 | 50 | 5.20 | 15.65 | 455 | 35 |
| Example 2 | Compound 3 | 4.88 | 50 | 4.88 | 17.20 | 453 | 40 |
| Example 3 | Compound 6 | 4.52 | 50 | 4.52 | 22.00 | 450 | 45 |
| Example 4 | Compound 10 | 5.20 | 50 | 4.90 | 18.50 | 460 | 42 |
| Comparative Example 1 | Comparative Compound C1 | 5.42 | 50 | 5.42 | 15.50 | 463 | 33 |

In Table 2, the evaluation results of the organic electroluminescence devices of Example 1 to Example 4 and Comparative Example 1 are shown. In Table 2, the driving voltage, luminance, emission efficiency, emission wavelength and life of the organic electroluminescence devices thus manufactured are compared and shown. The emission efficiency represents a current efficiency value with respect to a current density of 50 mA/cm$^2$.

Referring to the results of Table 2, it can be seen that the organic electroluminescence devices of Example 1 to Example 4 showed a similar degree of luminance and emission efficiency when compared with the organic electroluminescence device of Comparative Example 1. However, the organic electroluminescence devices of Example 1 to Example 4 showed a decreased driving voltage and an increased life when compared with the organic electroluminescence device of Comparative Example 1.

The organometallic compound of an embodiment includes a metal complex and a condensed ring group containing boron (B) as a ring-forming atom, and has a high MLCT ratio, and thus, may show high quantum efficiency. In addition, the organic electroluminescence device of an embodiment includes an organometallic compound having a metal complex and a condensed ring group containing boron (B) as a ring-forming atom in an emission layer and may show excellent emission efficiency properties and improved life characteristics.

The organic electroluminescence device of an embodiment includes an organometallic compound having a substituent of a condensed ring containing boron, and may show improved device properties of high efficiency and long life.

The organometallic compound of an embodiment includes a condensed ring group containing boron, and may contribute to the increase of efficiency and life of an organic electroluminescence device.

Although exemplary embodiments of the present disclosure have been described, it is understood that the present disclosure should not be limited to these exemplary embodiments, and instead the present disclosure is intended to cover various changes and modifications that can be made by one ordinary skilled in the art within the spirit and scope of the appended claims, and equivalents thereof.

What is claimed is:

1. An organic electroluminescence device, comprising:

a first electrode;

a second electrode on the first electrode; and an emission layer between the first electrode and the second electrode, wherein the emission layer comprises an organometallic compound represented by the following Formula 2A:

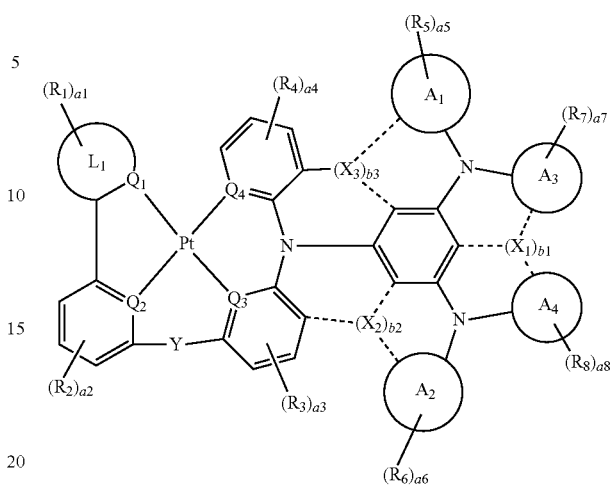

Formula 2-A in Formula 2-A,

Y is O, or NR$_a$,

Q$_1$ to Q$_4$ are each independently C or N, at least one selected from among b1 to b3 is 1 and the remainder are 0, where when b1 is 1, X$_1$ is B, when b1 is 0, X$_1$ is absent, when b2 is 1, X$_2$ is B, when b2 is 0, X$_2$ is absent, when b3 is 1, X$_3$ is B, and when b3 is 0, X$_3$ is absent, A$_1$ to A$_4$ are each independently a substituted or unsubstituted aromatic ring of 5 to 10 carbon atoms for forming a ring, or a substituted or unsubstituted heterocycle of 2 to 10 carbon atoms for forming a ring including N, O, or S as a heteroatom, R$_1$ to R$_8$, and R$_a$ are each independently a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, a1 to a8 are each independently an integer of 0 to 3, and wherein L$_1$ is represented by the following Formula L-4, L-7, or L-100:

Formula L-4

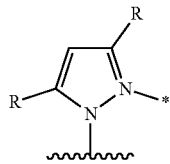

Formula L-7

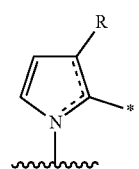

Formula L-100

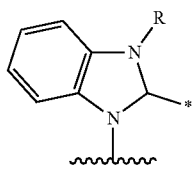

in Formula L-4, L-7 and L-100,

R is a hydrogen atom, a deuterium atom, a substituted or unsubstituted alkyl group of 1 to 20 carbon atoms, or a substituted or unsubstituted aryl group of 6 to 30 carbon atoms for forming a ring.

2. The organic electroluminescence device of claim 1, wherein the emission layer is to emit phosphorescence.

3. The organic electroluminescence device of claim 1, wherein the emission layer comprises a host and a dopant, and the dopant is represented by Formula 2-A.

4. The organic electroluminescence device of claim 1, wherein the emission layer comprises at least one selected from among compounds represented in the following Formula Compound Group 1:

Compound Group 1

1

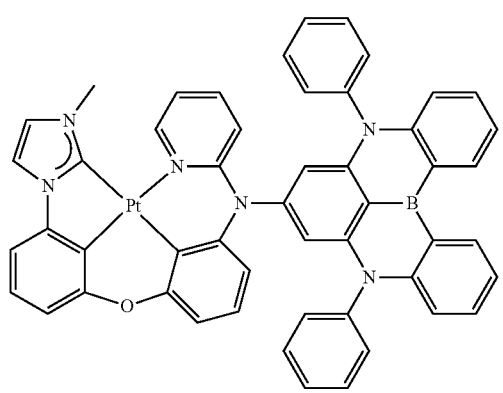

2

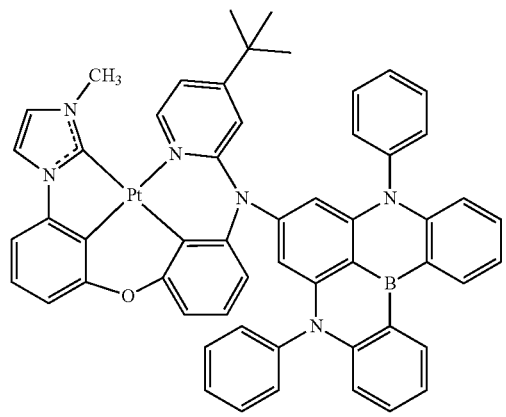

3

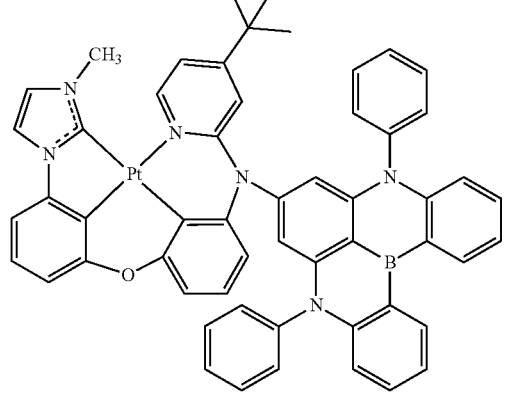

4

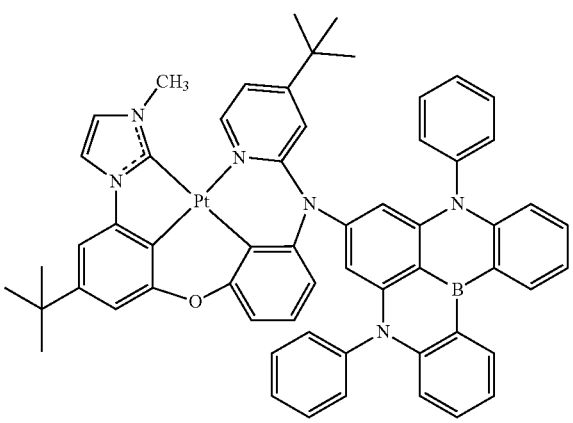

5

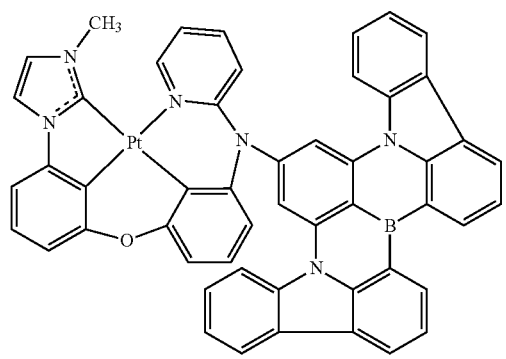

6
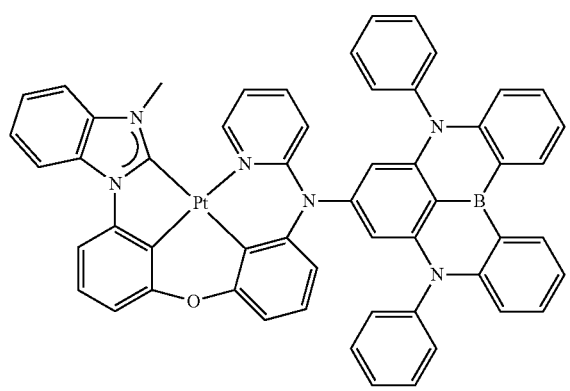
7
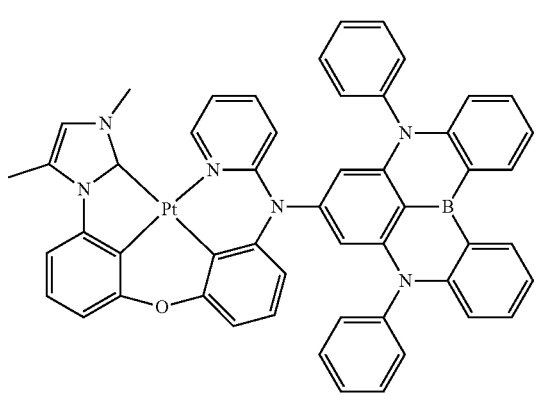
8
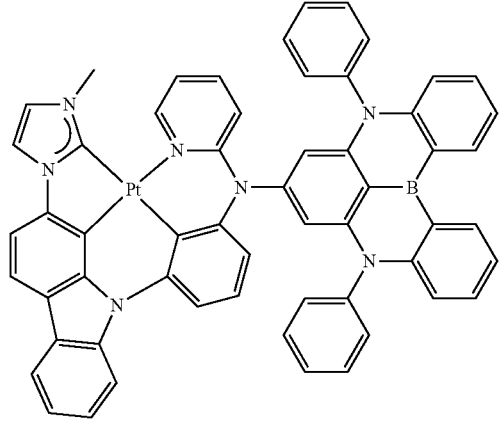
9
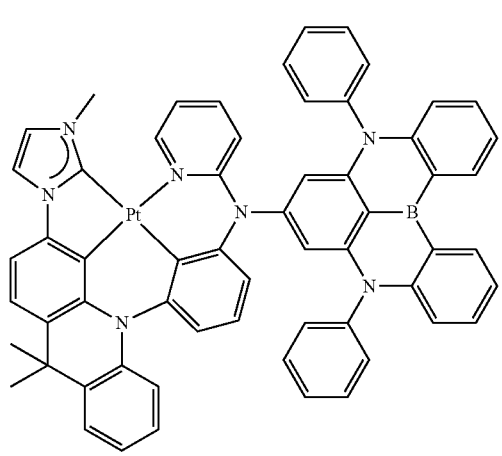
10
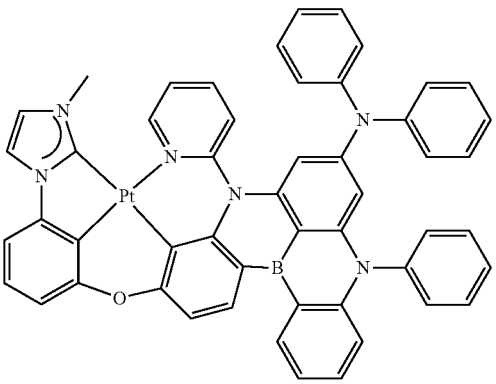
11
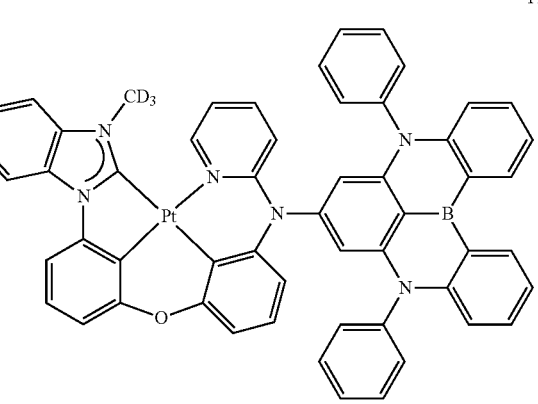
12
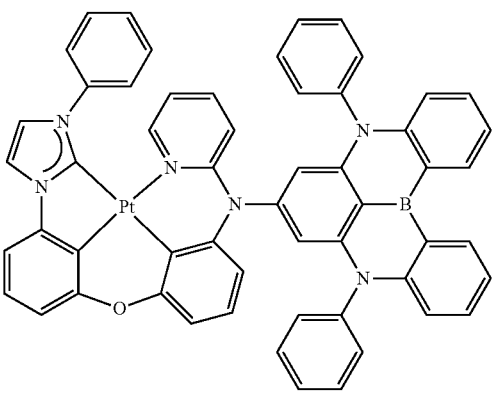
13
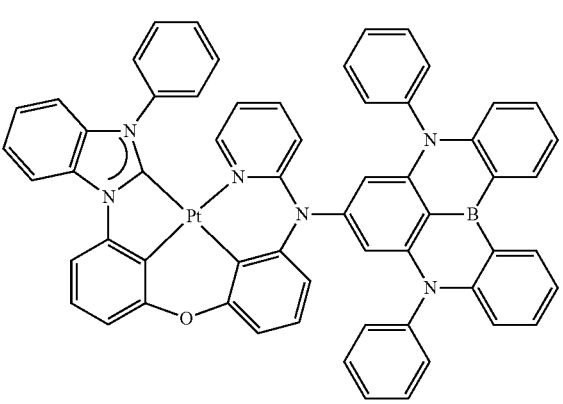

14
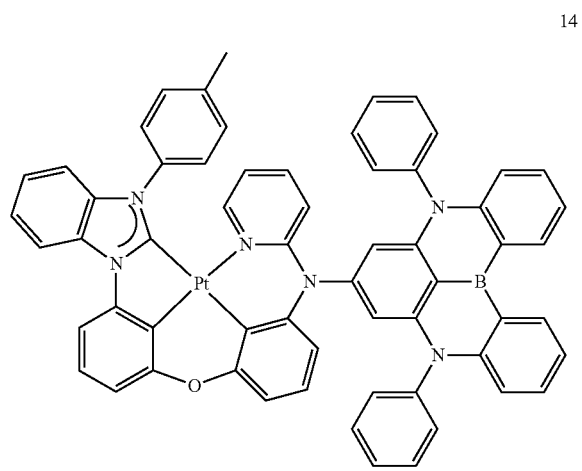
15
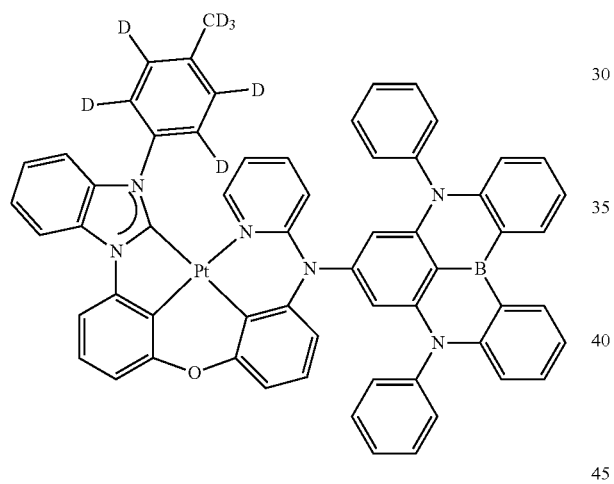
16
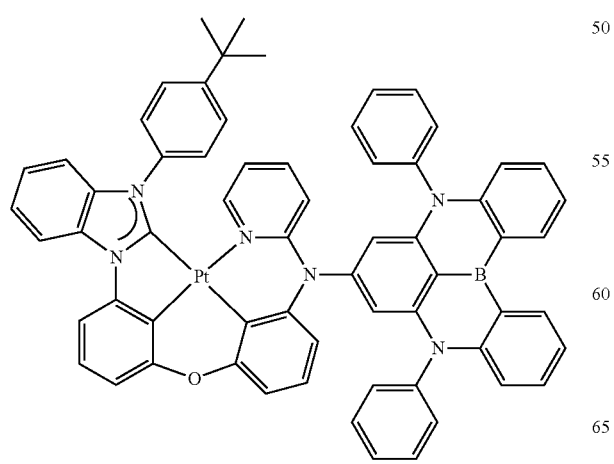
17
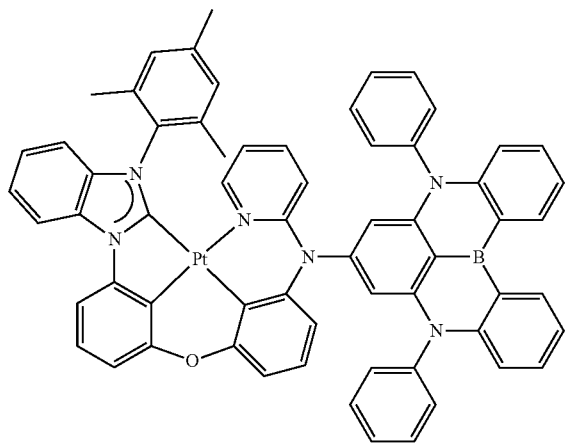
18
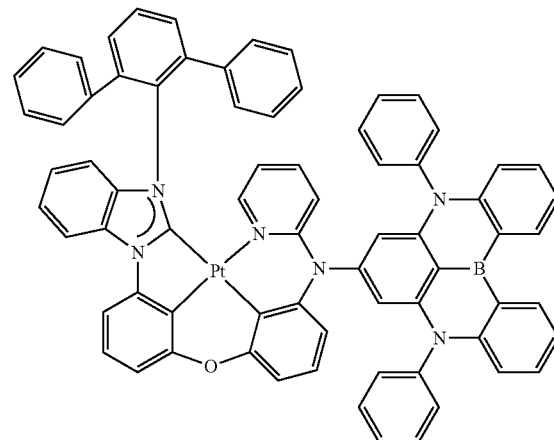
19
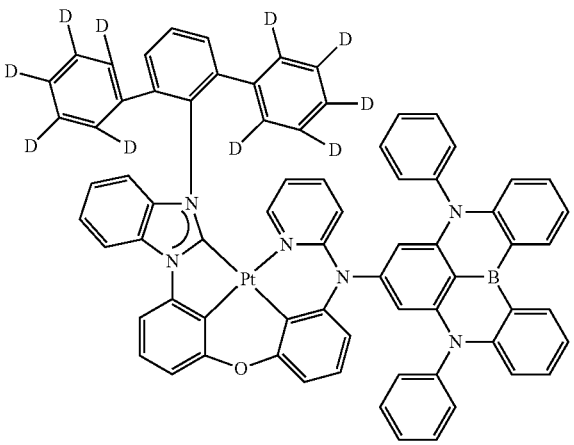

-continued

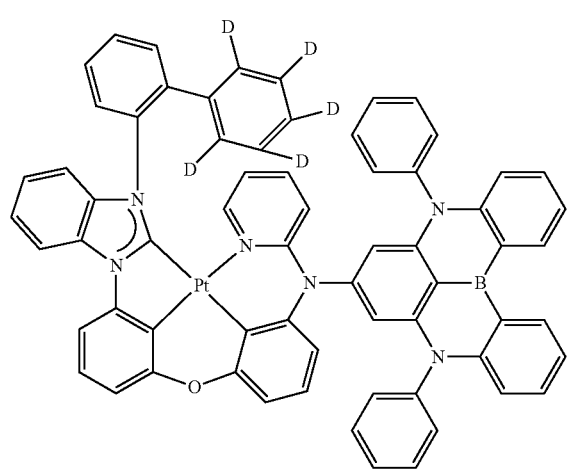

20

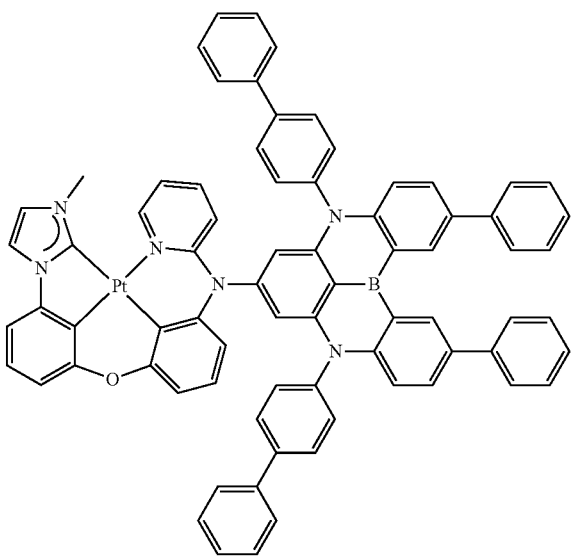

21

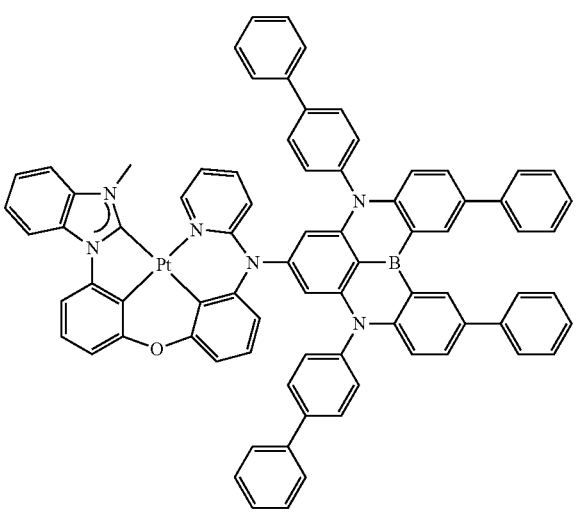

22

-continued

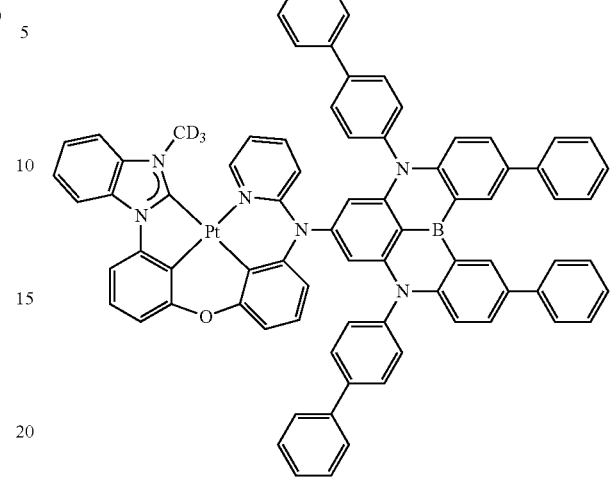

23

5. An organometallic compound represented by the following Formula 2-A:

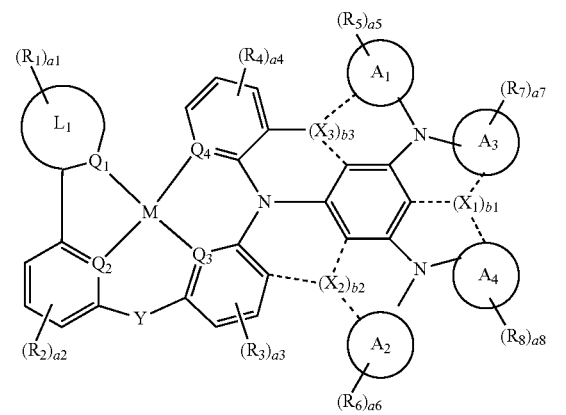

Formula 2-A in Formula 2-A,
Y is O, or $NR_a$,
$Q_1$ to $Q_4$ are each independently C or N,
at least one selected from among b1 to b3 is 1 and the remainder are 0, where when b1 is 1, $X_1$ is B, when b1 is 0, $X_1$ is absent, when b2 is 1, $X_2$ is B, when b2 is 0, $X_2$ is absent, when b3 is 1, $X_3$ is B, and when b3 is 0, $X_3$ is absent,
$A_1$ to $A_4$ are each independently a substituted or unsubstituted aromatic ring of 5 to 10 carbon atoms for forming a ring, or a substituted or unsubstituted heterocycle of 2 to 10 carbon atoms for forming a ring including N, O, or S as a heteroatom,
$R_1$ to $R_8$, and $R_a$ are each independently a hydrogen atom, a deuterium atom, a halogen atom, a cyano group, a substituted or unsubstituted amine group, a substituted or unsubstituted silyl group, a substituted or unsubstituted carbonyl group, a substituted or unsubstituted oxy group, a substituted or unsubstituted thio group, a substituted or unsubstituted alkyl group of 1 to 20 carbon atoms, a substituted or unsubstituted alkenyl group of 2 to 20 carbon atoms, a substituted or unsubstituted alkynyl group of 2 to 20 carbon atoms, a substituted or unsubstituted aryl group of 6 to 30 carbon atoms for forming a ring, or a substituted or unsubstituted heteroaryl group of 2 to 30 carbon atoms for forming a ring, or combined with an adjacent group to form a ring, a1 to a8 are each independently an integer of 0 to 3, and wherein $L_1$ is represented by the following Formula L-4, L-7, or L-100:

Formula L-4

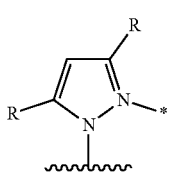

Formula L-7

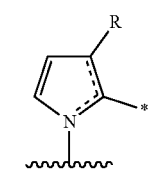

Formula L-100

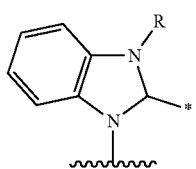

in Formula L-4, L-7 and L-100,

R is a hydrogen atom, a deuterium atom, a substituted or unsubstituted alkyl group of 1 to 20 carbon atoms, or a substituted or unsubstituted aryl group of 6 to 30 carbon atoms for forming a ring.

6. The organometallic compound of claim 5, wherein Formula 1 is represented by any one selected from among compounds in the following Formula Compound Group 1:

Compound Group 1

1

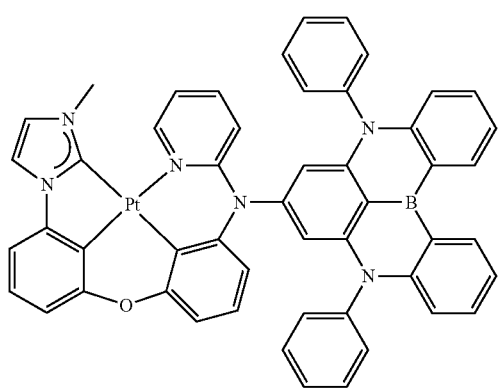

2

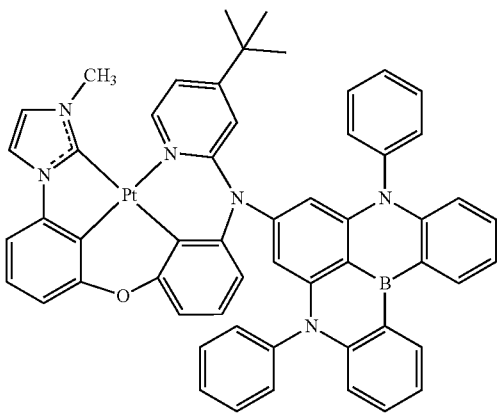

3

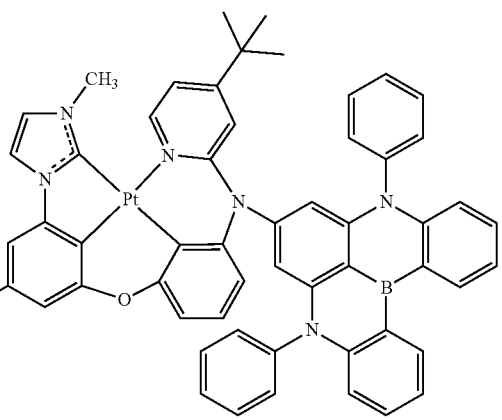

4

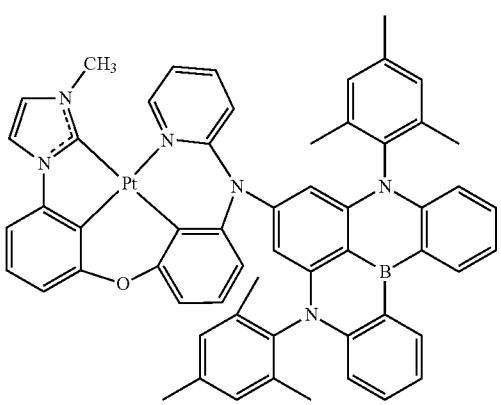

5

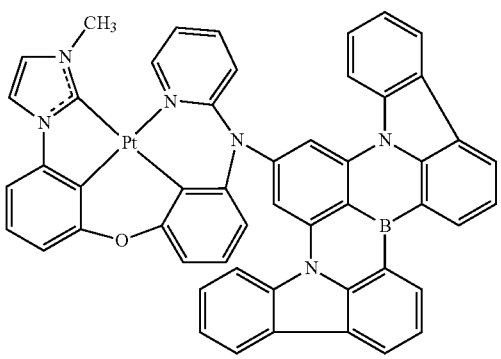

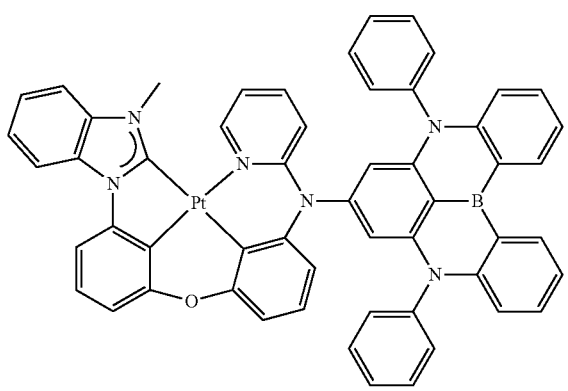
6
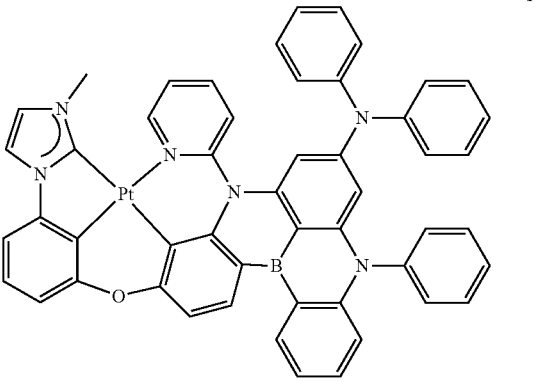
10
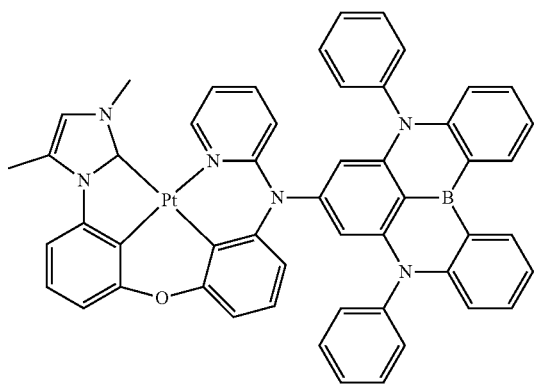
7
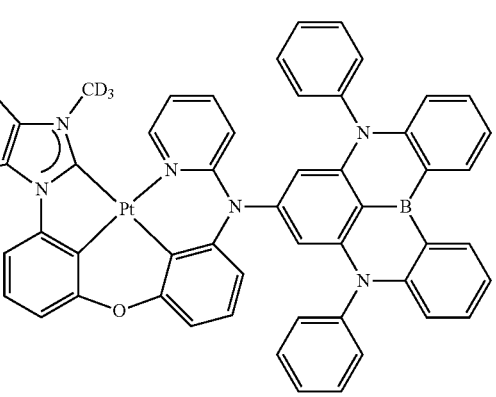
11
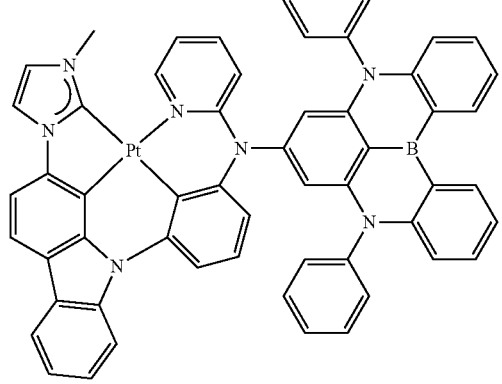
8
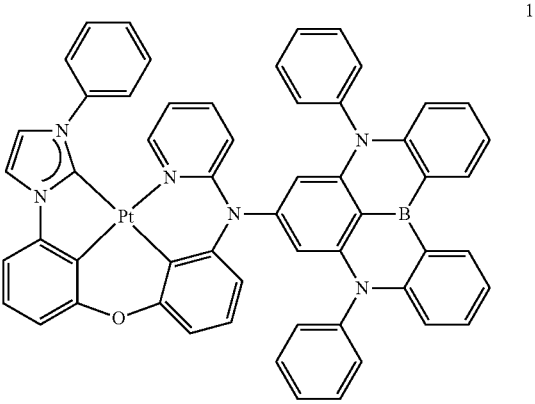
12
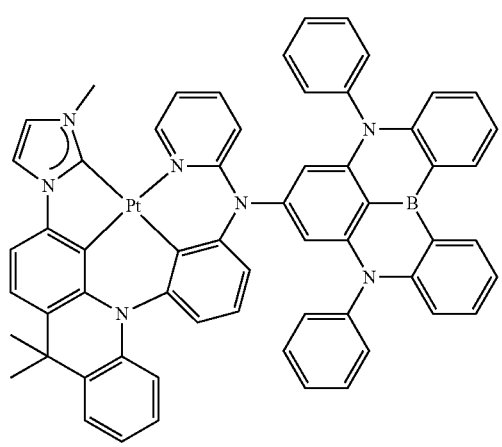
9
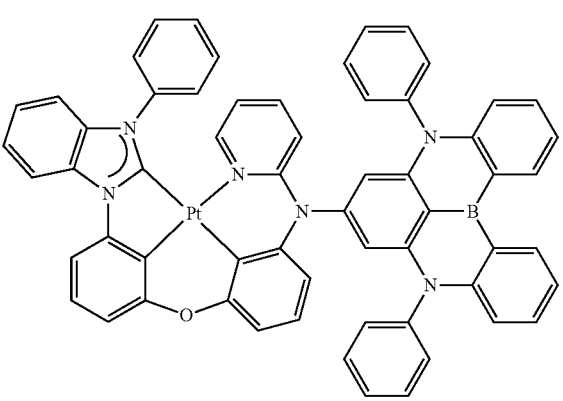
13

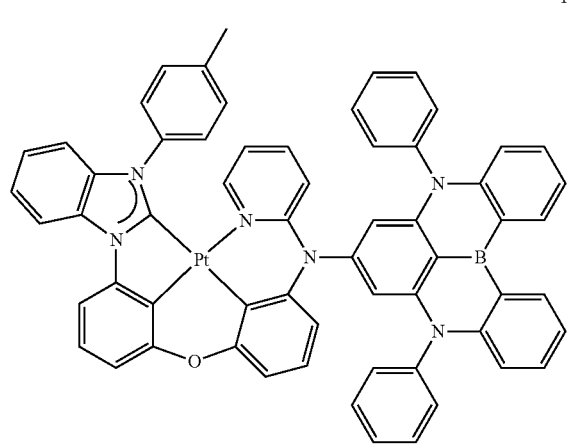
14
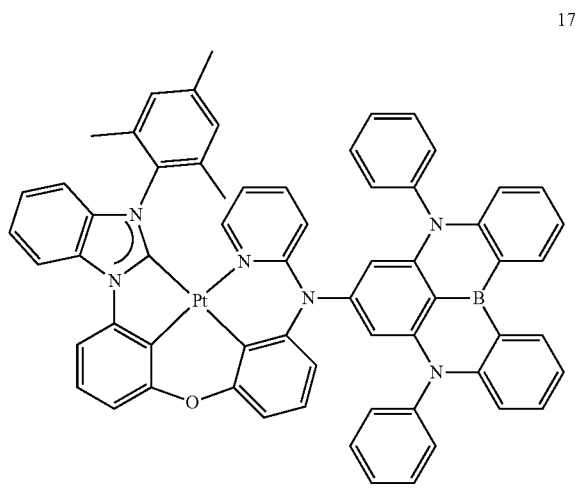
17
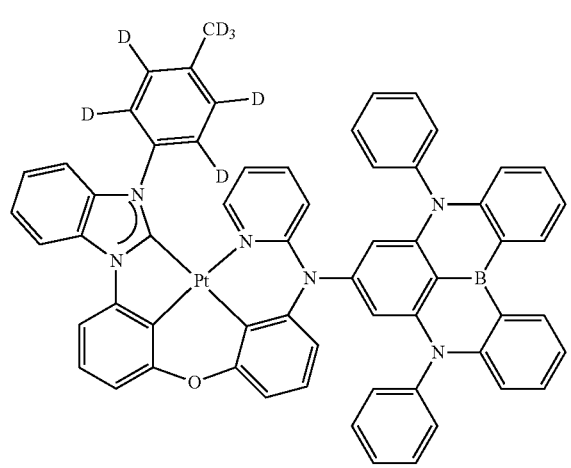
15
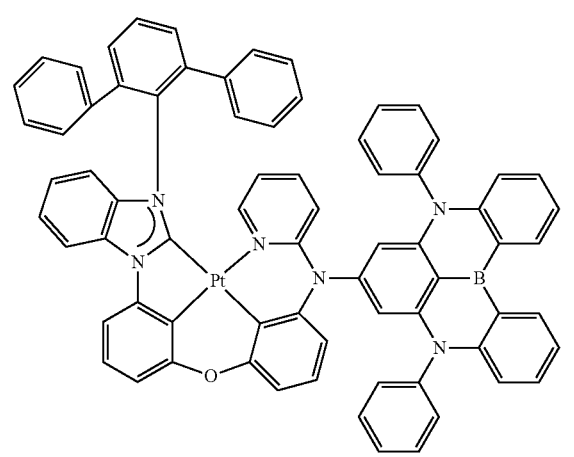
18
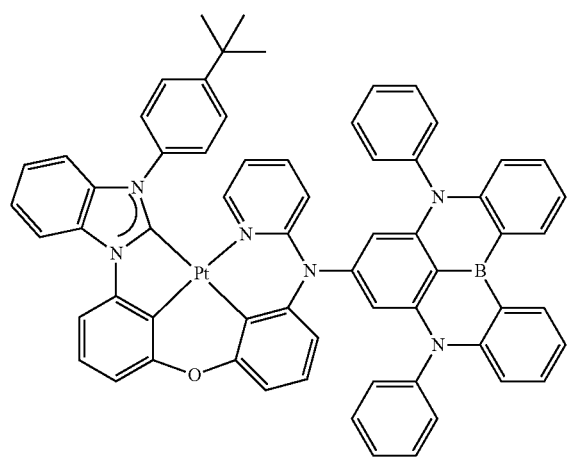
16
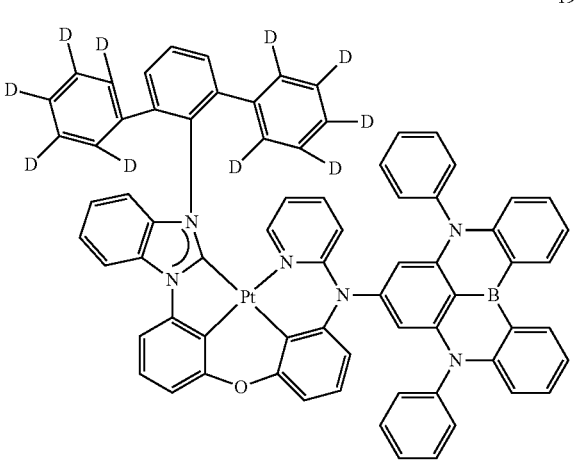
19

20

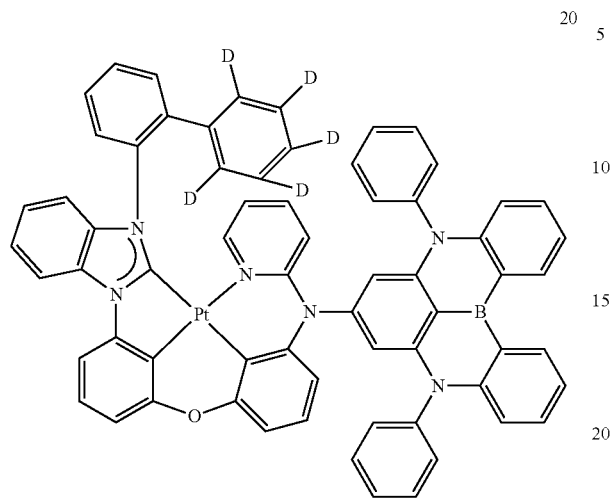

21

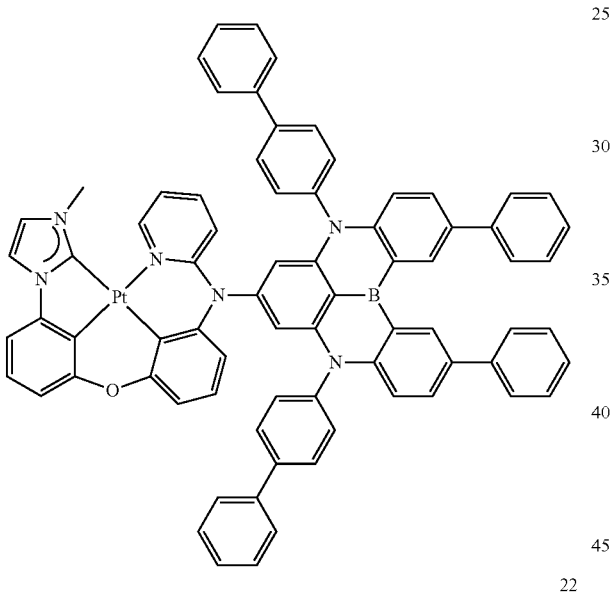

22

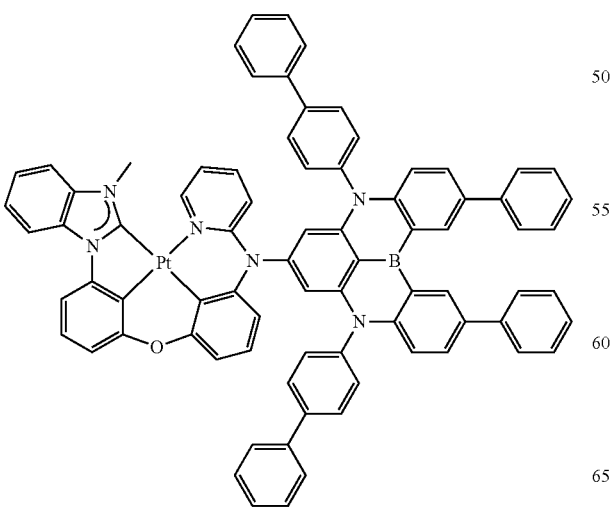

5

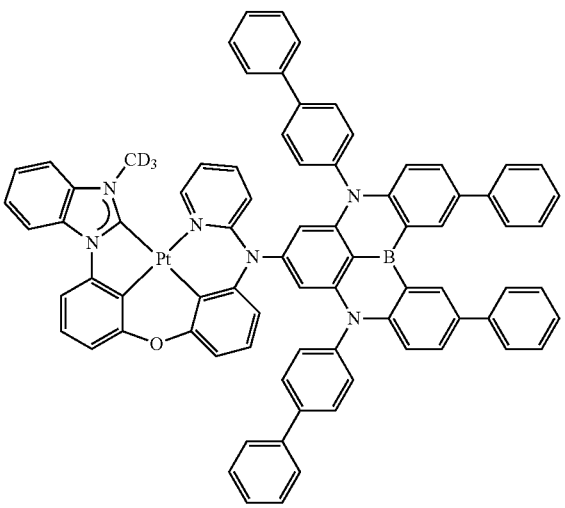

23

7. An organometallic compound represented by the following Formula A:

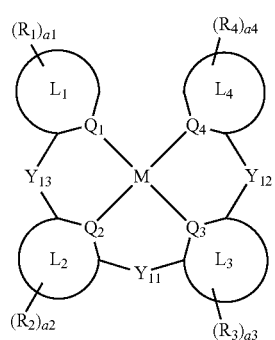

Formula A in Formula A,

M is Pt, $Q_1$ to $Q_4$ are each independently C or N, $L_2$ to $L_4$ are each independently a substituted or unsubstituted benzene ring, or a substituted or unsubstituted pyridine ring, $Y_{11}$ is O or $NR_a$, $Y_{12}$ is $NR_{a1}$, $Y_{13}$ is a direct linkage, $R_{a1}$ is substituted or unsubstituted condensed rings having three or more rings and containing at least one B as a ring-forming atom, $R_1$ to $R_4$, and $R_a$ are each independently a hydrogen atom, a deuterium atom, a substituted or unsubstituted alkyl group of 1 to 20 carbon atoms, or a substituted or unsubstituted aryl group of 6 to 30 carbon atoms for forming a ring, or combined with an adjacent group to form a ring, and a1 to a4 are each independently an integer of 0 to 3, and wherein $L_1$ is represented by the following Formula L-4, L-7 or L-100:

Formula L-4

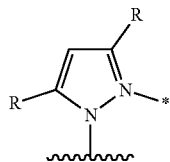

Formula L-7

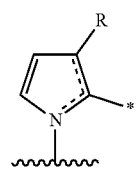

Formula L-100

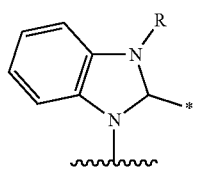

in Formula L-4, L-7 and L-100,

R is a hydrogen atom, a deuterium atom, a substituted or unsubstituted alkyl group of 1 to 20 carbon atoms, or a substituted or unsubstituted aryl group of 6 to 30 carbon atoms for forming a ring.

8. The organometallic compound of claim 7, wherein Formula A is represented by any one selected from among compounds represented in the following Compound Group 1:

Compound Group 1

1

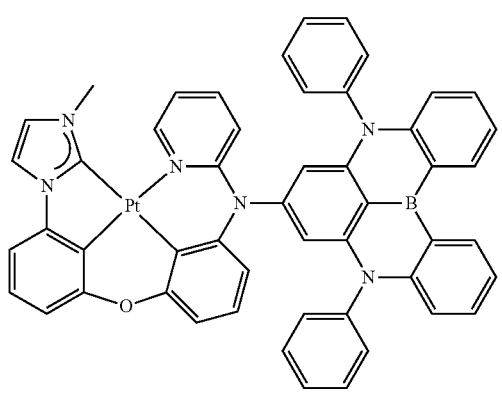

2

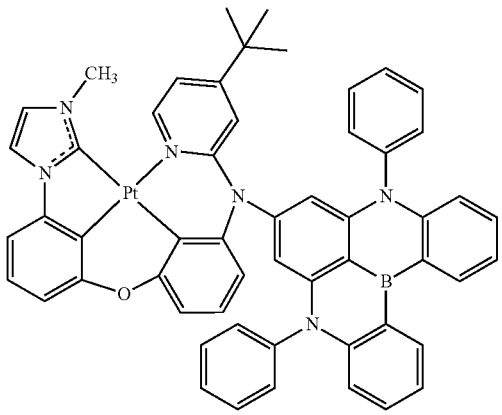

3

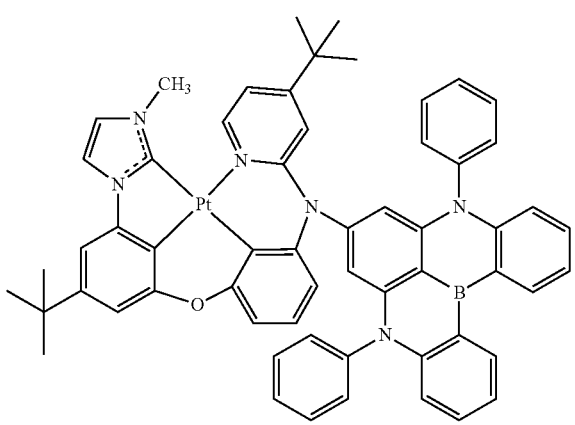

4

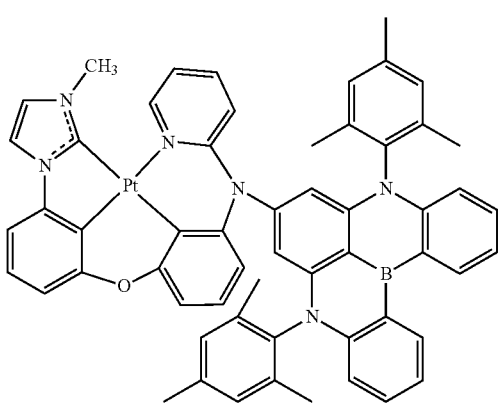

5

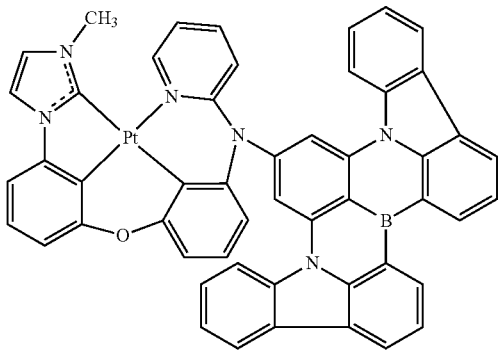

6
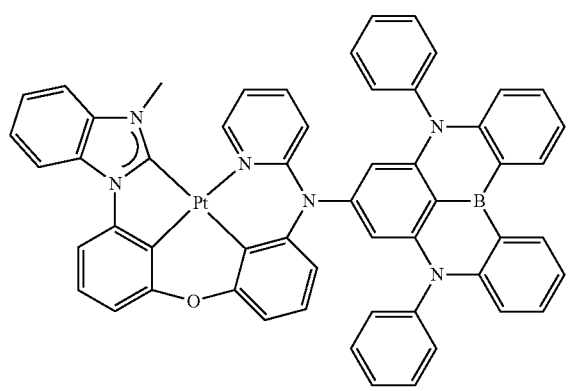
7
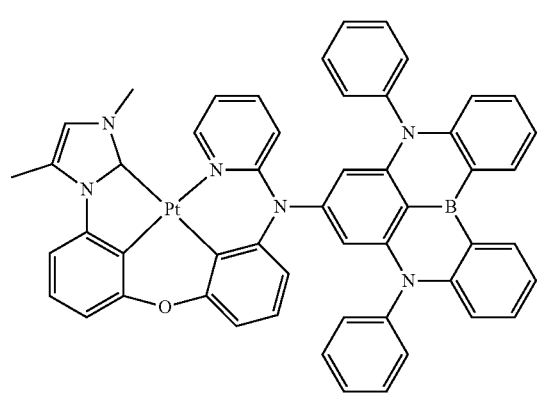
8
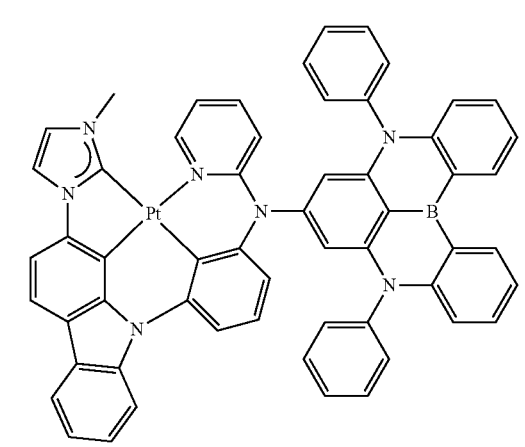
9
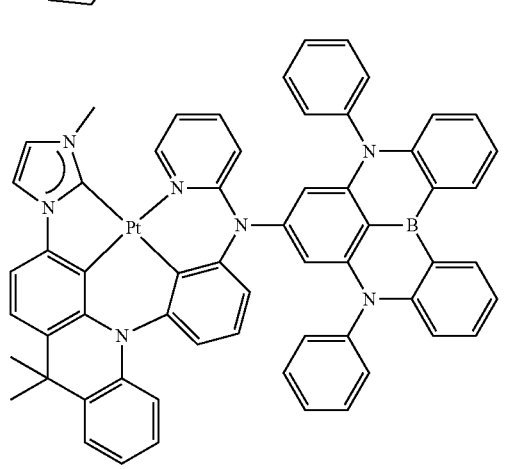
10
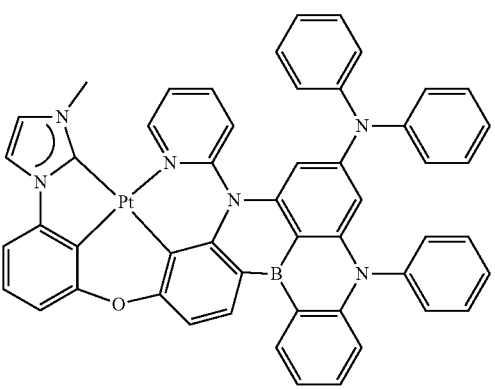
11
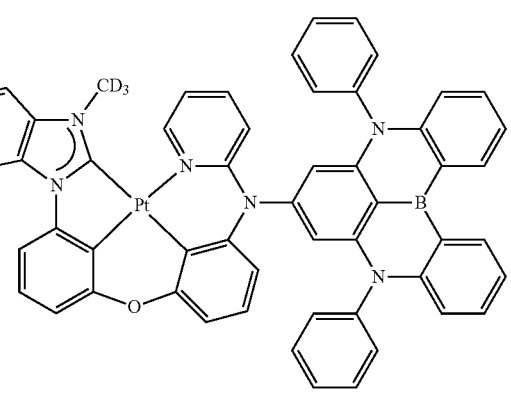
12
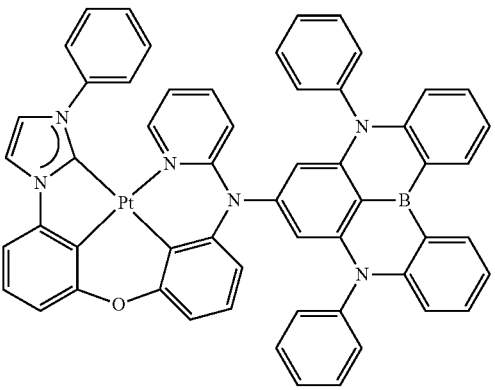
13
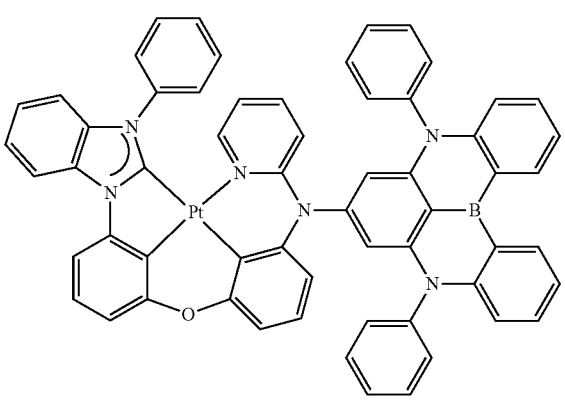

14
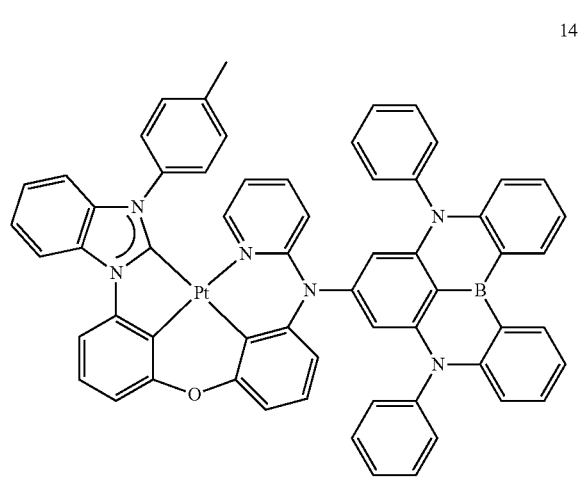
17
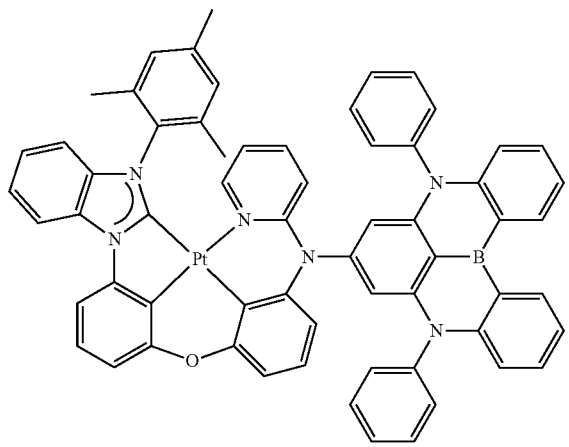
15
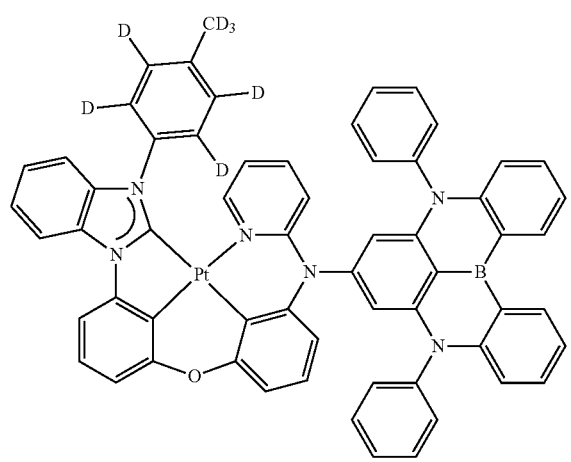
18
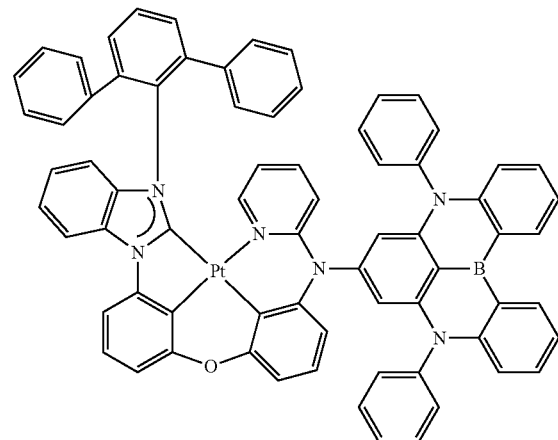
16
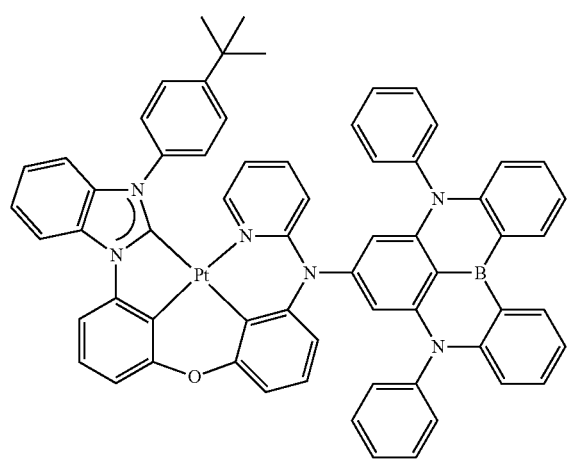
19
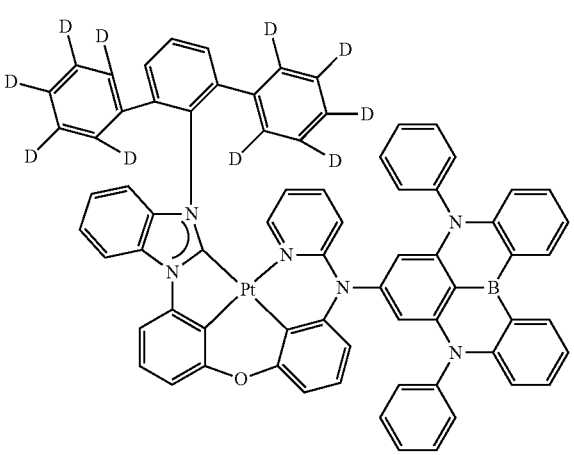

20
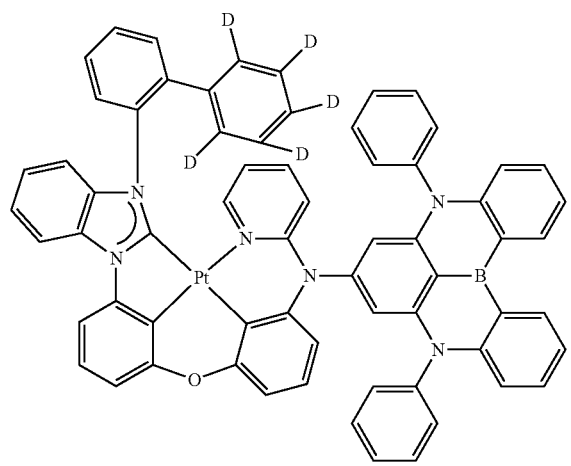
21
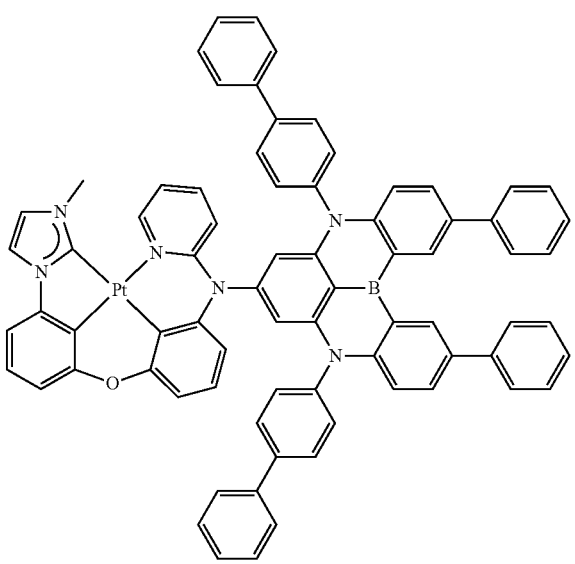
22
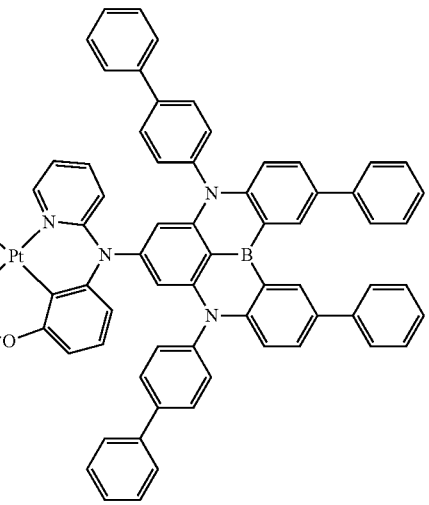
23
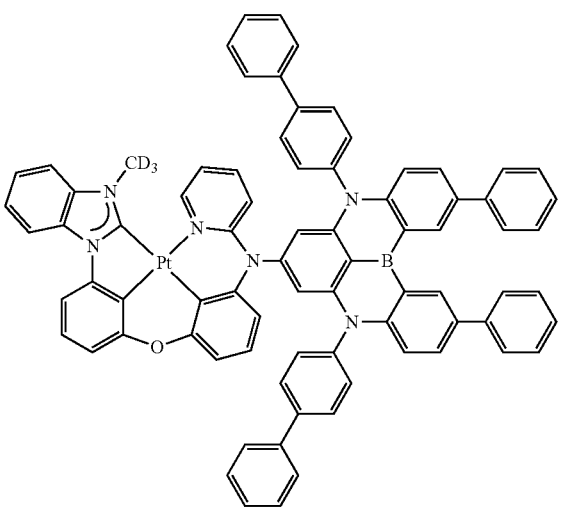
* * * * *

UNITED STATES PATENT AND TRADEMARK OFFICE
CERTIFICATE OF CORRECTION

PATENT NO. : 11,758,805 B2
APPLICATION NO. : 16/907940
DATED : September 12, 2023
INVENTOR(S) : Haejin Kim et al.

Page 1 of 3

It is certified that error appears in the above-identified patent and that said Letters Patent is hereby corrected as shown below:

In the Claims

In Column 56, Lines 54-65, in Claim 1, below "L-100:" delete "  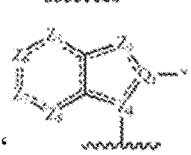 ".

In Column 57, Lines 12-17, in Claim 1, in Formula L-7, delete " 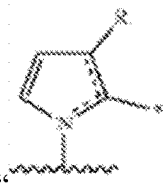 " and insert

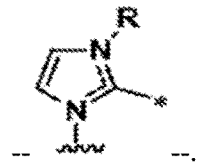 --.

Signed and Sealed this
Twenty-sixth Day of December, 2023

Katherine Kelly Vidal
*Director of the United States Patent and Trademark Office*

CERTIFICATE OF CORRECTION (continued)
U.S. Pat. No. 11,758,805 B2

In Column 59, Lines 19-33, in Claim 4, in Compound Group 1-7, delete

" 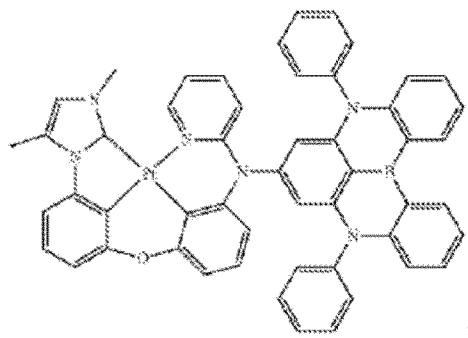 " and insert -- 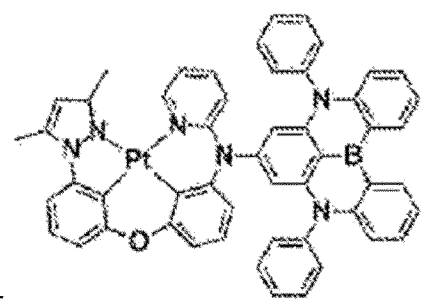 --.

In Column 65, Lines 24-29, in Claim 5, in Formula L-7, delete "  " and insert -- 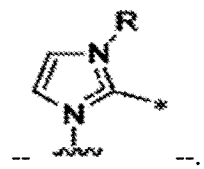 --.

In Column 67, Lines 18-33, in Claim 6, in Compound Group 1-7, delete

" 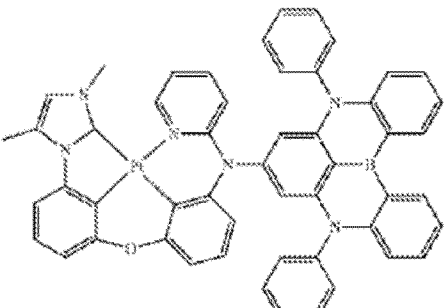 " and insert -- 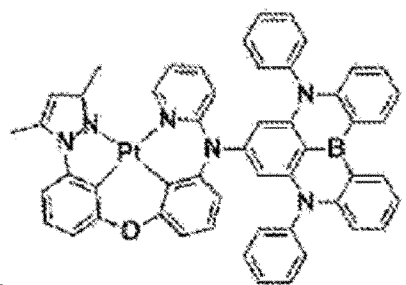 --.

In Column 73, Lines 20-24, in Claim 7, in Formula L-7, delete "  " and insert -- 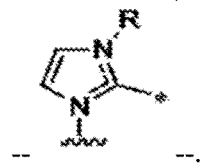 --.

CERTIFICATE OF CORRECTION (continued)
U.S. Pat. No. 11,758,805 B2

In Column 75, Lines 18-32, in Claim 8, in Compound Group 1-7, delete

" 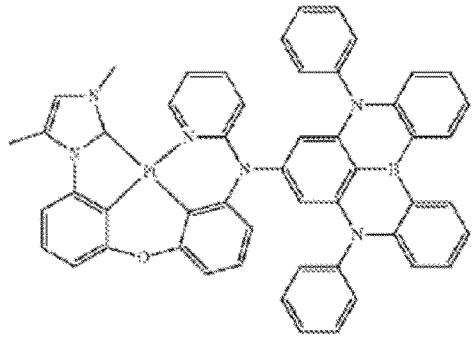 " and insert -- 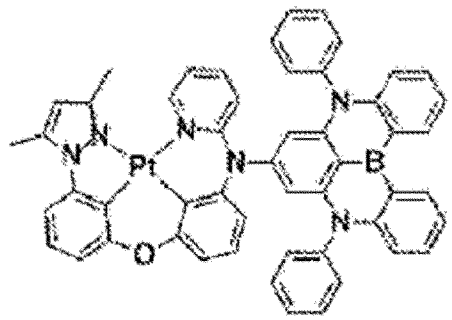 --.